(12) United States Patent
Chen et al.

(10) Patent No.: US 12,170,235 B2
(45) Date of Patent: Dec. 17, 2024

(54) SEAL RING STRUCTURE FOR SEMICONDUCTOR DEVICE AND THE METHOD THEREOF

(71) Applicant: Taiwan Semiconductor Manufacturing Company, Ltd., Hsinchu (TW)

(72) Inventors: Chun Yu Chen, Hsinchu (TW); Yen Lian Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 17/708,894

(22) Filed: Mar. 30, 2022

(65) Prior Publication Data
US 2023/0028005 A1    Jan. 26, 2023

Related U.S. Application Data

(60) Provisional application No. 63/224,756, filed on Jul. 22, 2021.

(51) Int. Cl.
*H01L 23/10* (2006.01)
*H01L 27/092* (2006.01)

(52) U.S. Cl.
CPC .......... *H01L 23/10* (2013.01); *H01L 27/0924* (2013.01)

(58) Field of Classification Search
CPC ................ H01L 23/10; H01L 27/0924; H01L 29/41766; H01L 29/42392; H01L 29/78696; H01L 21/823821; H01L 29/0673; H01L 29/66439; H01L 29/66545; H01L 29/6681; H01L 29/775; H01L 23/564; H01L 23/585; B82Y 10/00
See application file for complete search history.

(56) References Cited

U.S. PATENT DOCUMENTS

| | | | |
|---|---|---|---|
| 2015/0255593 A1* | 9/2015 | Yu | H01L 29/6681 257/401 |
| 2021/0257449 A1* | 8/2021 | Hong | H01L 27/0886 |
| 2022/0037521 A1* | 2/2022 | You | H01L 29/66439 |

FOREIGN PATENT DOCUMENTS

TW    201336021 A    9/2013

OTHER PUBLICATIONS

Chun Yu Chen et al., Seal Structures, U.S. Appl. No. 17/465,556, filed Sep. 2, 2021, Assignee: Taiwan Semiconductor Manufacturing Company, Ltd., 32 pages specification, 13 pages drawings.
(Continued)

*Primary Examiner* — Karen Kusumakar
*Assistant Examiner* — Adam S Bowen
(74) *Attorney, Agent, or Firm* — HAYNES AND BOONE, LLP

(57) ABSTRACT

A semiconductor structure according to the present disclosure includes a circuit region disposed over a substrate and a seal ring region disposed over the substrate and completely surrounding the circuit region. The circuit region includes first fins, second fins, n-type epitaxial structures over the first fins, and p-type epitaxial structures over the second fins. The seal ring region includes fin rings extending completely around the circuit region, epitaxial rings disposed over and extending parallel to the fin rings. All of the epitaxial rings over all of the fin rings in the seal ring region are p-type epitaxial rings.

20 Claims, 25 Drawing Sheets

(56) References Cited

OTHER PUBLICATIONS

Chun Yu Chen et al., Seal Ring Structures, U.S. Appl. No. 17/581,251, filed Jan. 1, 2022, Assignee: Taiwan Semiconductor Manufacturing Company, Ltd., 31 pages specification, 10 pages drawings.
Chun Yu Chen et al., Seal Structures Including Passivation Structures, U.S. Appl. No. 17/703,668, filed Mar. 24, 2022, Assignee: Taiwan Semiconductor Manufacturing Company, Ltd., 24 pages specification, 9 pages drawings.

\* cited by examiner

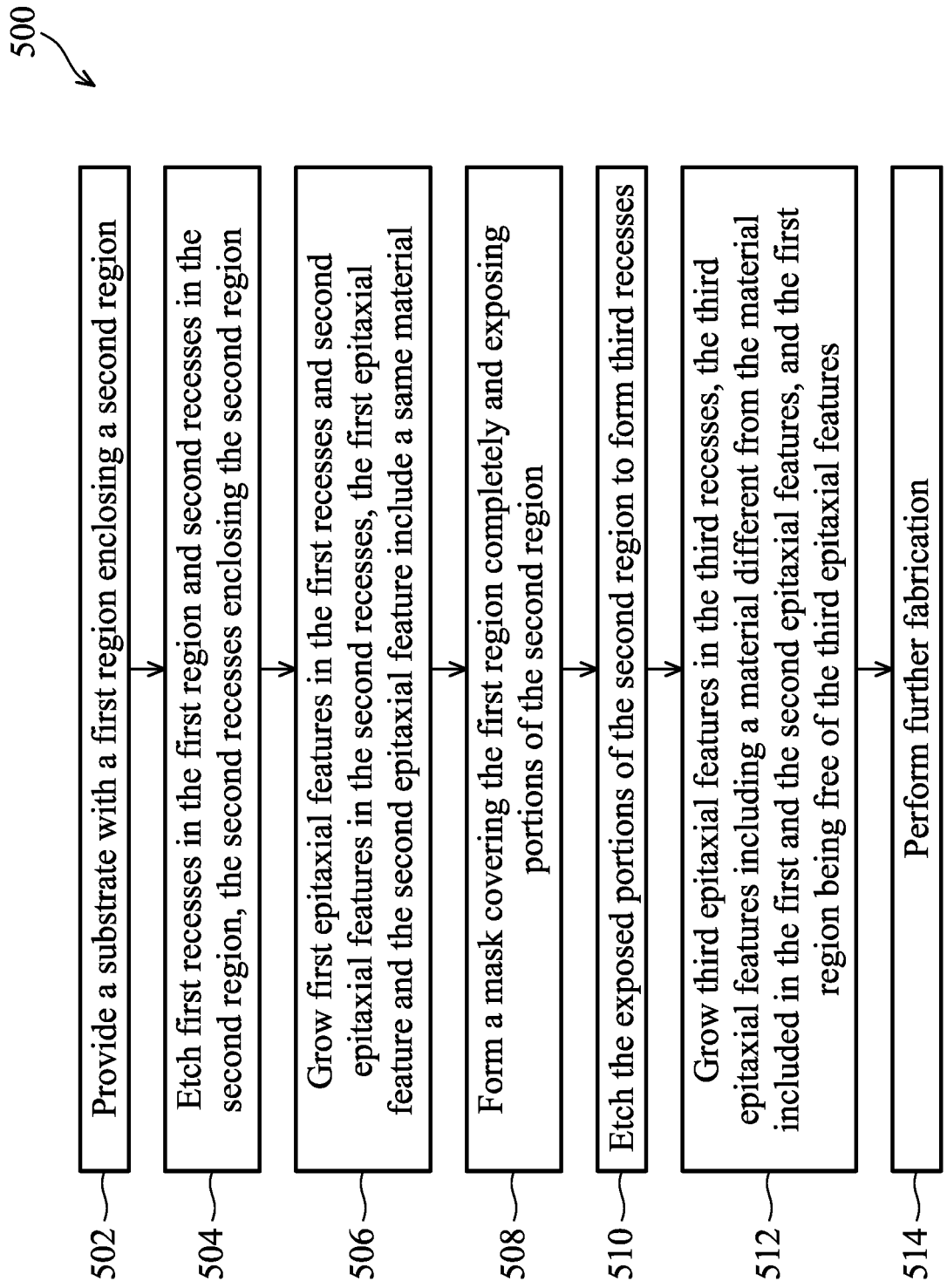

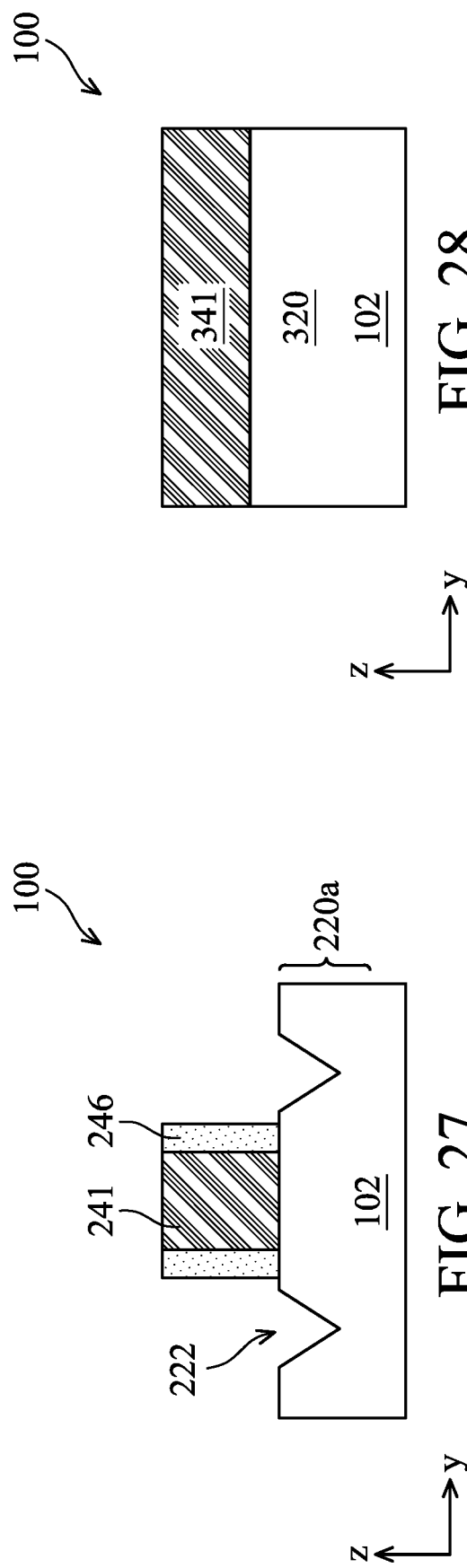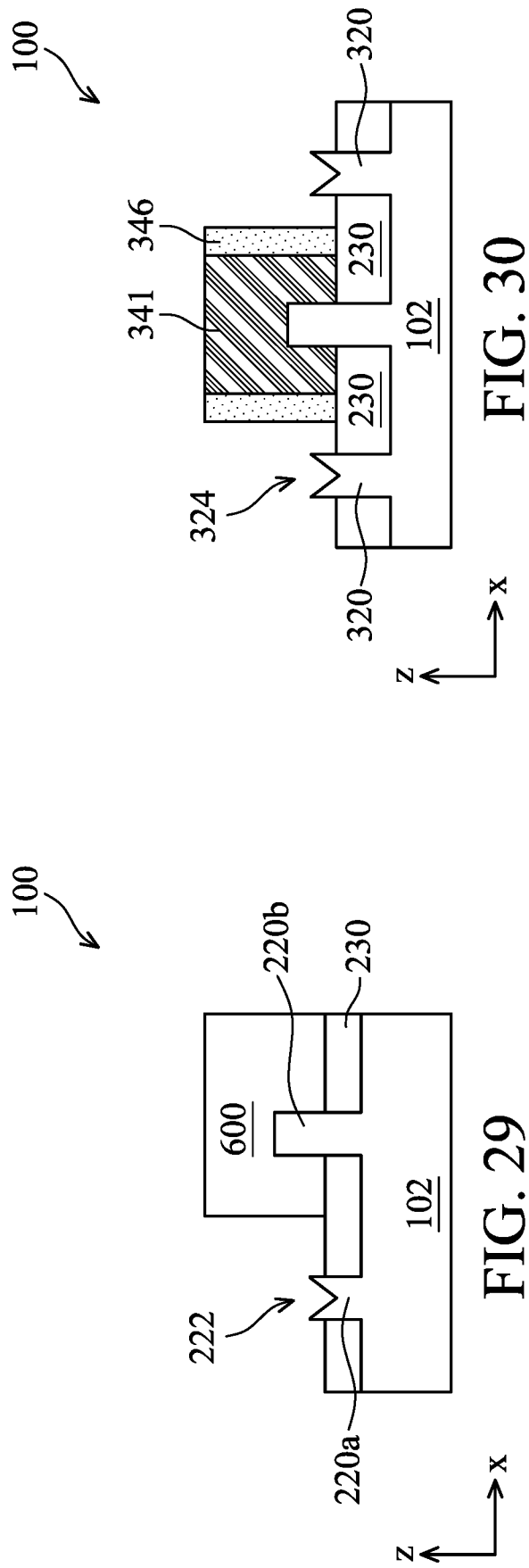

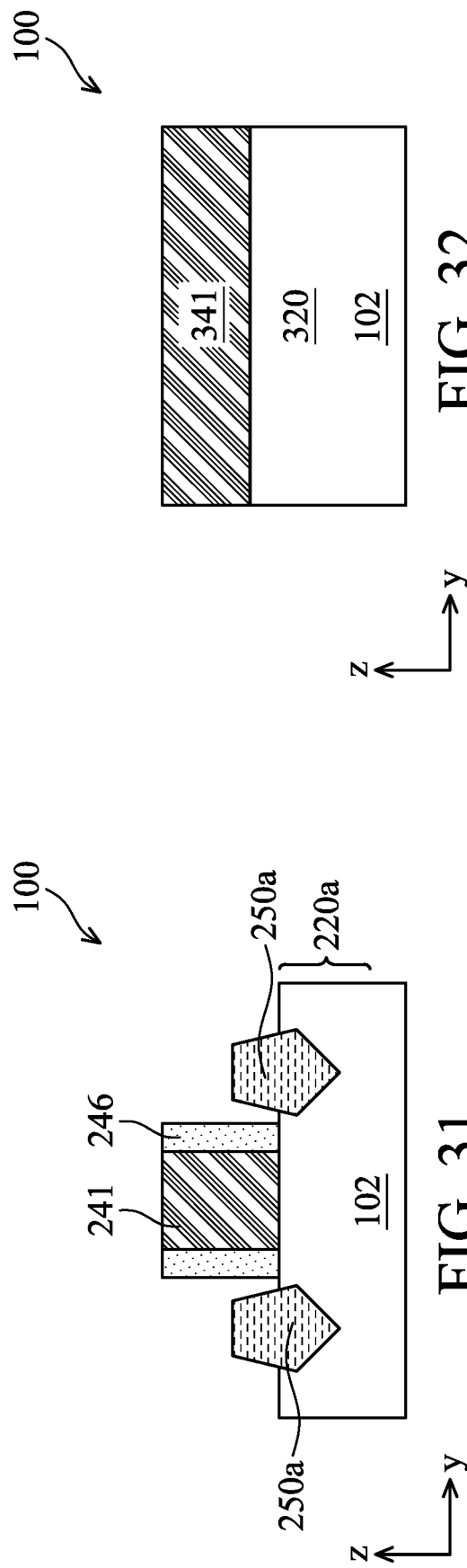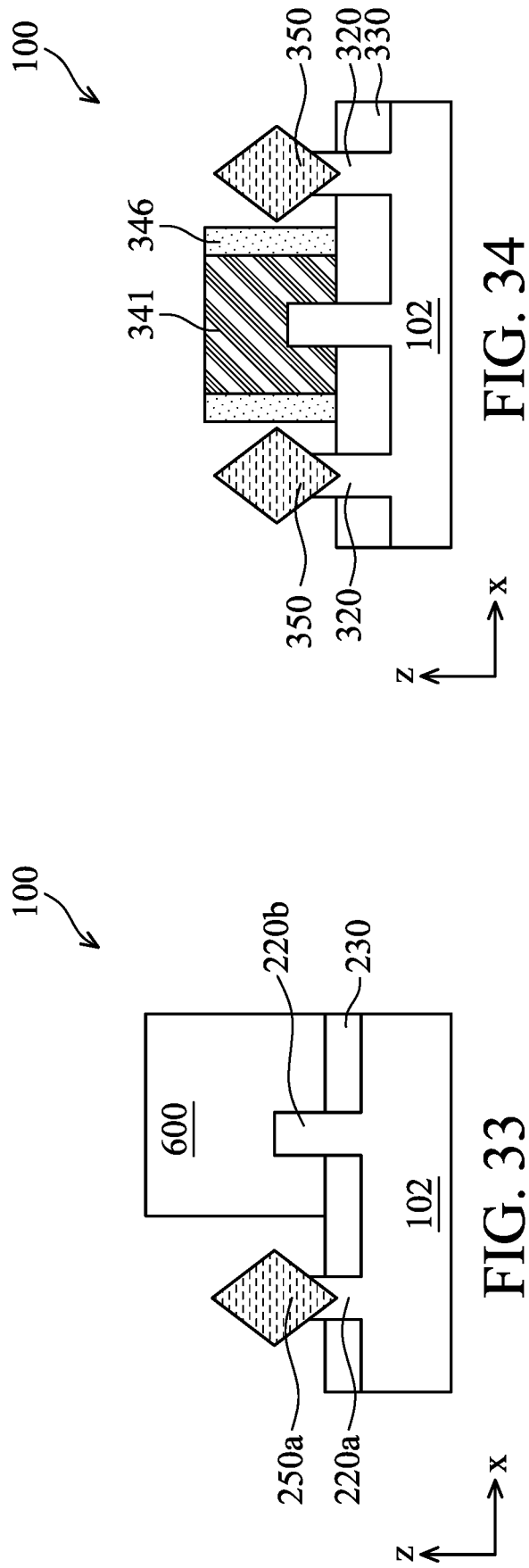

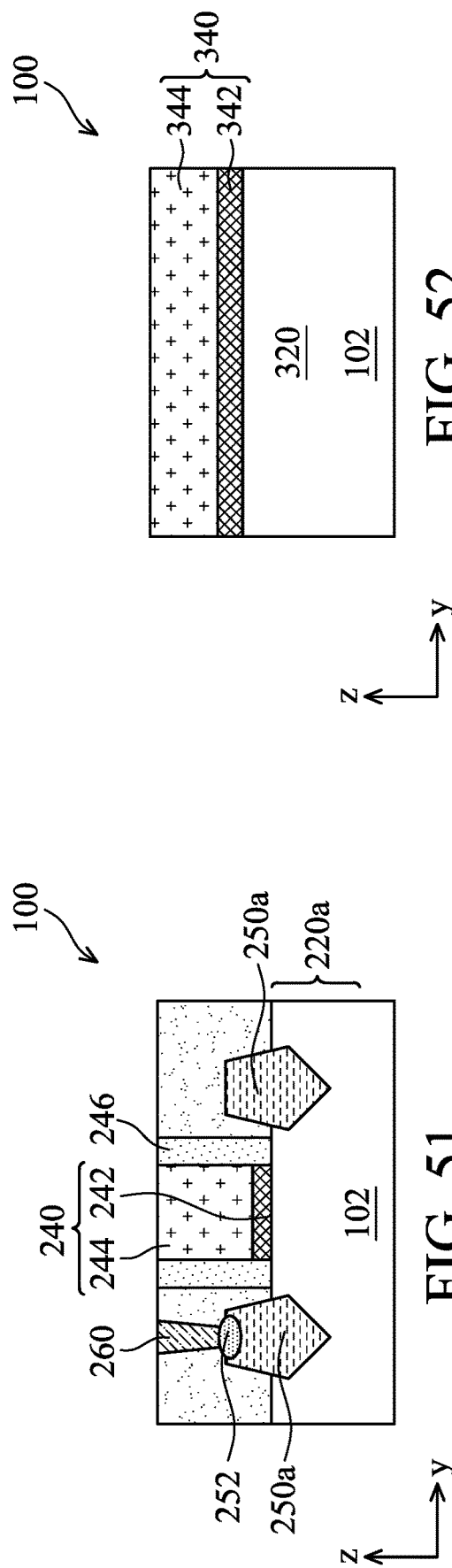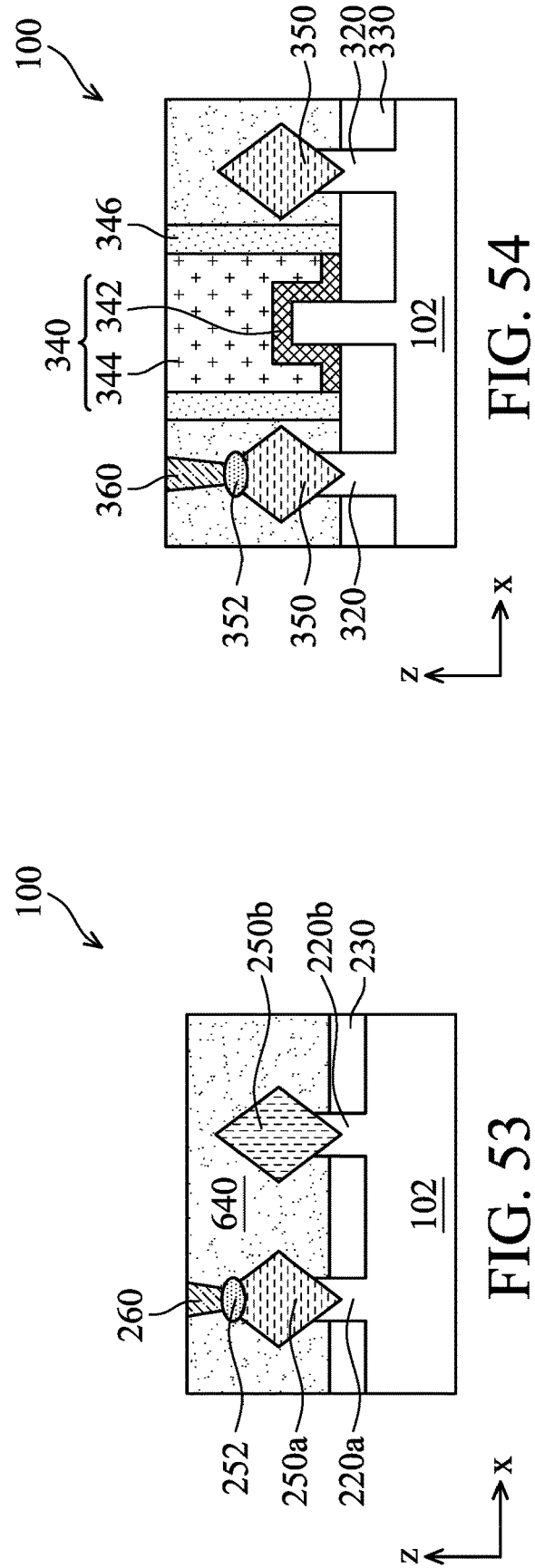

SEAL RING STRUCTURE FOR SEMICONDUCTOR DEVICE AND THE METHOD THEREOF

PRIORITY

This application claims the benefits to U.S. Provisional Application Ser. No. 63/224,756 filed Jul. 22, 2021, the entire disclosure of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to improve the stability and reliability of the seal ring.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 20 is a flow chart of a method of making the semiconductor structures in FIG. 1.

FIGS. 23, 27, 31, 35, 39, 43, 47, and 51 are cross-sectional views of the semiconductor structure in FIG. 1 along line "6-6" in FIG. 21 at intermediate stages of the method shown in FIG. 20, according to various embodiments of the present disclosure.

FIGS. 24, 28, 32, 36, 40, 44, 48, and 52 are cross-sectional views of the semiconductor structure in FIG. 1 along line "2-2" in FIG. 22 at intermediate stages of the method shown in FIG. 20, according to various embodiments of the present disclosure.

FIGS. 25, 29, 33, 37, 41, 45, 49, and 53 are cross-sectional views of the semiconductor structure in FIG. 1 along line "7-7" in FIG. 21 at intermediate stages of the method shown in FIG. 20, according to various embodiments of the present disclosure.

FIGS. 26, 30, 34, 38, 42, 46, 50, and 54 are cross-sectional views of the semiconductor structure in FIG. 1 along line "1-1" in FIG. 22 at intermediate stages of the method shown in FIG. 20, according to various embodiments of the present disclosure.

DETAILED DESCRIPTION

Figure 1:
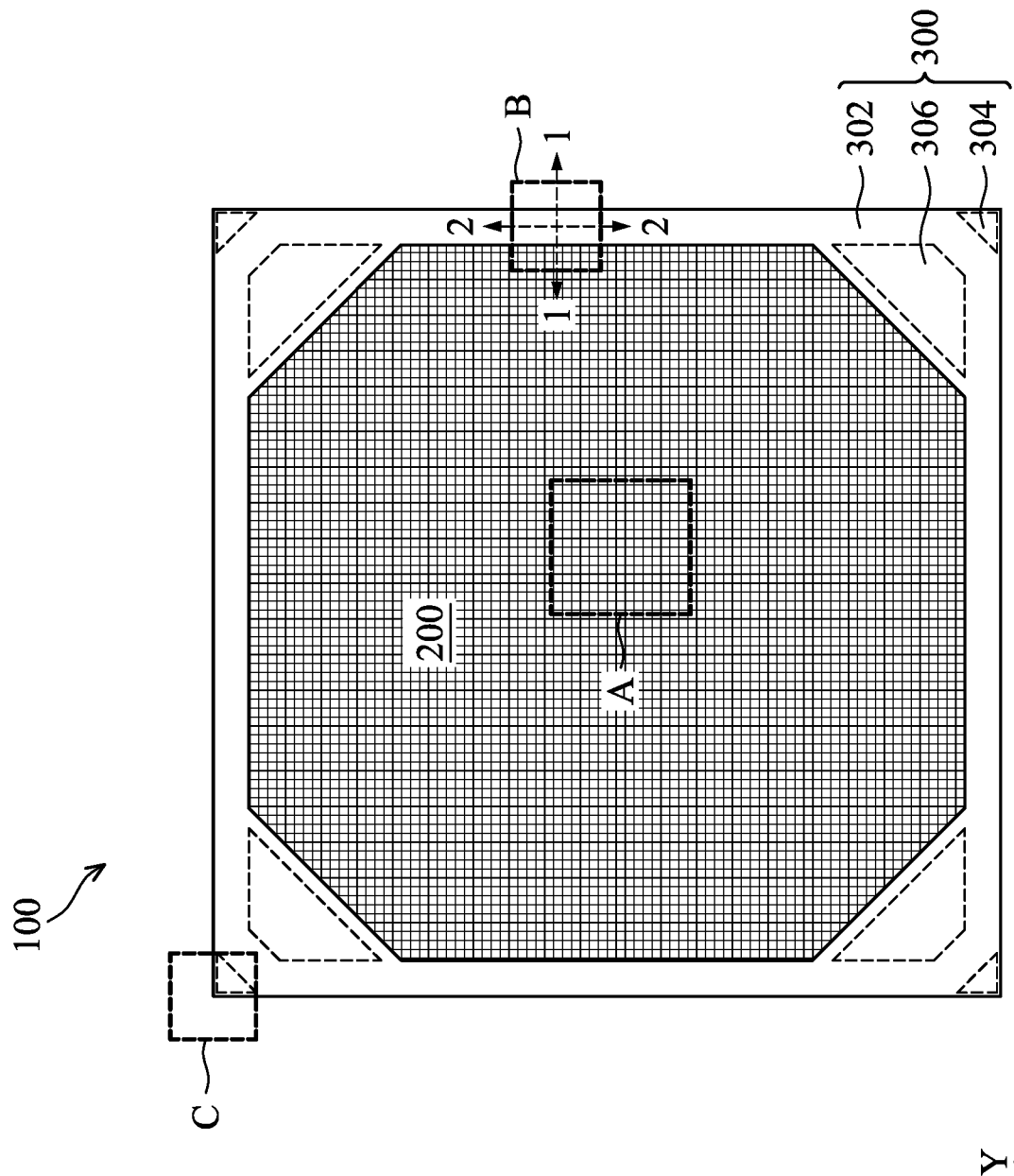
FIG. 1 is a top plan view of a semiconductor structure with a seal ring structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The seal ring structure may be formed simultaneously with the structures in circuit area (or chip area, device area) and may include components of transistors similar to these in the transistors of the chip area. The components of transistors in the seal ring structure do not provide electrical functions for the chip as the device region do. Instead, the components of transistors in the seal ring structure encloses and protects the chip area from moisture, mechanical stress, or other defect-generating mechanism. When the chip area includes n-type transistors with n-type epitaxial structures (or source/drain structures) and p-type transistors with p-type epitaxial structures, corresponding n-type epitaxial structures and p-type epitaxial structures may be found in the seal ring area as well. The n-type epitaxial structures and the p-type epitaxial structures are formed in separate processes. During the later processes of forming different types of epitaxial structures, the previously formed epitaxial structures may be damaged due to processing limitations, such as misalignments and over etching, therefore jeopardizing the stability and reliability of the previously formed epitaxial structures. For example, if the p-type epitaxial structures are formed first, they may be inadvertently etched in the processes of forming the n-type epitaxial structures due to misalignments. The inadvertent etching may affect the stability and/or reliability of the p-type epitaxial structure that serves as portions of the seal ring structure.

This application generally relates to semiconductor structures and fabrication processes thereof. More particularly, this application provides a seal ring structure with a single type of epitaxial structures to improve the processability and the seal ring stability. The components of transistors in the seal ring structure do not provide electrical functions for the chip as the device region do. Instead, the components of transistors in the seal ring structure enclose and protect the chip area from moisture, mechanical stress, or other defect-generating mechanism. Therefore, the type of the epitaxial structure in the seal ring region can be manipulated to avoid damages in subsequent processes.

In the embodiments of the present disclosure, all of the epitaxial structures in the seal ring region may be of the same material and have the same conductivity type. For example, all of the epitaxial structures in the seal ring region are n-type, p-type, or undoped epitaxial structures. In one embodiment, all of the epitaxial structures in the seal ring region are p-type epitaxial structures, where the seal ring region is free of n-type epitaxial structures. In another embodiment, all of the epitaxial structures in the seal ring region are n-type epitaxial structures, where the seal ring region is free of p-type epitaxial structures. In some embodiments, the p-type epitaxial structures provide more stability to the seal ring structure. The single type epitaxial structures in the seal ring region prevent the inadvertent damage brought about by introducing epitaxial structures of a different type, such as over etching of the existing epitaxial structures during the forming of subsequent epitaxial structures. Those of ordinary skill in the art should appreciate that they may readily use the present disclosure as a basis for designing or modifying other processes and structures for carrying out the same purposes and/or achieving the same advantages of the embodiments introduced herein.

FIG. 1 is a top plan view of the semiconductor structure 100 according to the present disclosure. The semiconductor structure 100 (such as a manufactured wafer or a part thereof) includes a seal ring region 300 that encloses a circuit region (or device region, IC die, chip area) 200. In some embodiments, the semiconductor structure 100 may include other seal ring region(s) enclosing the seal ring 300 or other seal ring(s) enclosed by the seal ring region 300. Also, seal ring 300 may enclose other circuit region(s). The circuit region 200 may include any circuits, such as memory, processor, transmitter, receiver, and so on. The exact functionality of the circuit region 200 is not limited by the present disclosure.

In the present embodiment, the seal ring region 300 includes seal ring structures 302 (FIGS. 1 and 4) that have a rectangular or substantially rectangular periphery fully surrounds the device region 200. The four corners of the rectangular periphery are replaced by sloped corner lines that connect the adjacent edges of the rectangular. In the present embodiments, each of the sloped corner lines is substantially 45° to the X direction. The seal ring region 300 further includes four outer corner regions 304 disposed at corners of the seal ring region 300. Each of the outer corner regions 304 is disposed outside the seal ring structure 302 and along corresponding sloped corner lines. The seal ring region 300 further includes four inner corner regions 306 disposed along the corresponding sloped corner lines and between the seal ring structure 302 and the device region 200. The outer corner regions 304 and the inner corner regions 306 provide further mechanical strength for the seal ring region 300. The outer corner regions 304 are substantially triangular in shape and the inner corner region 306 is substantially trapezoidal in shape. In some embodiments, the seal ring structures 302 may provide openings in selected locations and/or selected layers to allow interconnects between the circuit region 200 and other circuit regions not shown in FIG. 1. In some embodiments, the seal ring region 300 may have a non-rectangular shape.

Figure 2:
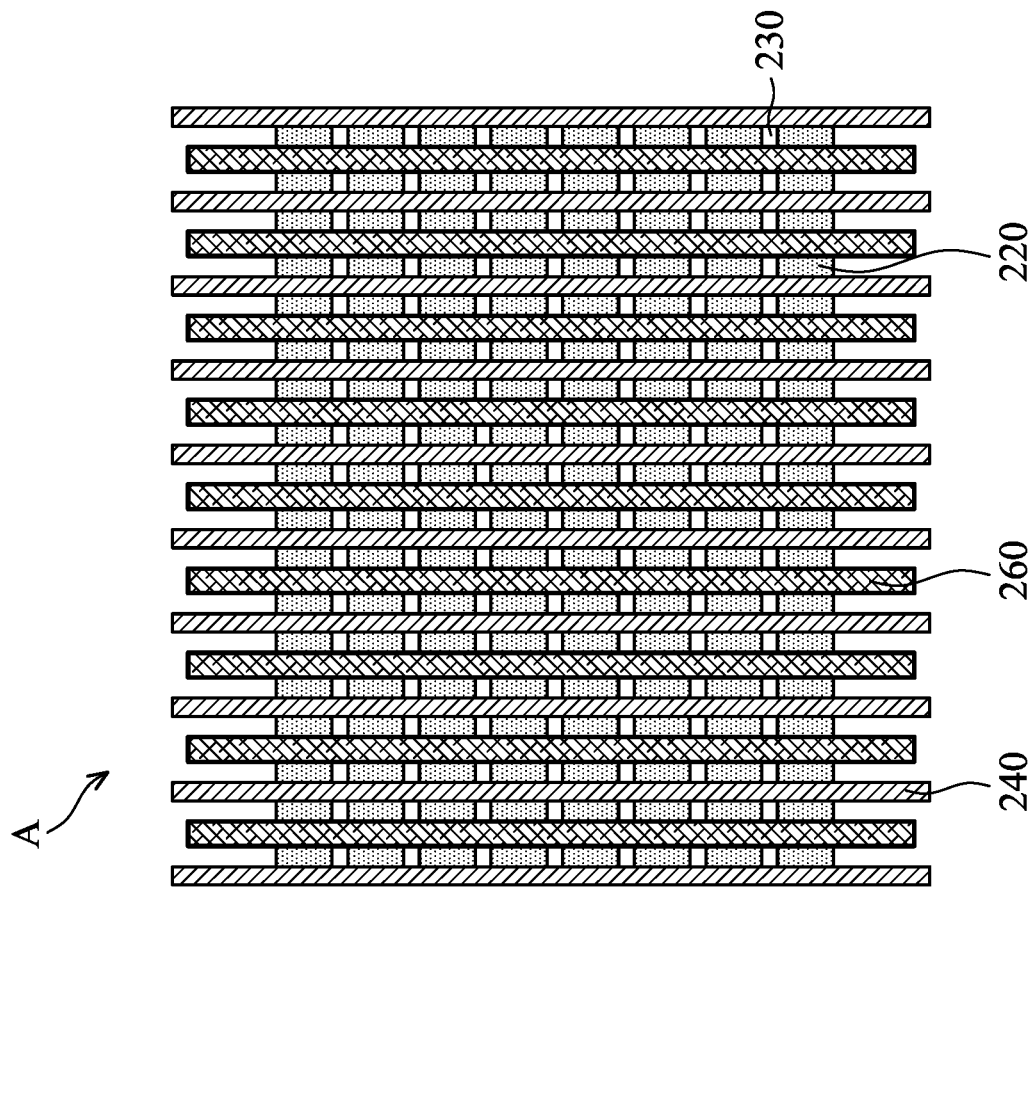
FIGS. 2 and 3 are zoomed-in top plan views of the area "A" and "B" of FIG. 1, respectively, according to various embodiments of the present disclosure.

FIG. 2 is a zoomed-in top plan view of the area A in the circuit region 200 shown in FIG. 1. The circuit region 200 includes fins (active regions) 220 oriented lengthwise along the X direction, isolation structures 230 disposed between and separating the fins 220, gate structures 240 oriented lengthwise along the Y direction over the fins 220, and contact structures 260 oriented lengthwise along the Y direction over the fins 220. The above elements form a matrix, and transistors are formed in the intersections between the fins 220 and the gate structures 240. The transistors may be planar metal-oxide-semiconductor field effect transistor (MOSFET) or multi-gate transistors. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

It is noted that while the fins 220 and gate structures 240 are depicted in FIG. 2 as extending continuously along the X direction or the Y direction, they may be divided into segments by dielectric features according to the circuit design of the semiconductor structure 100.

Figure 3:
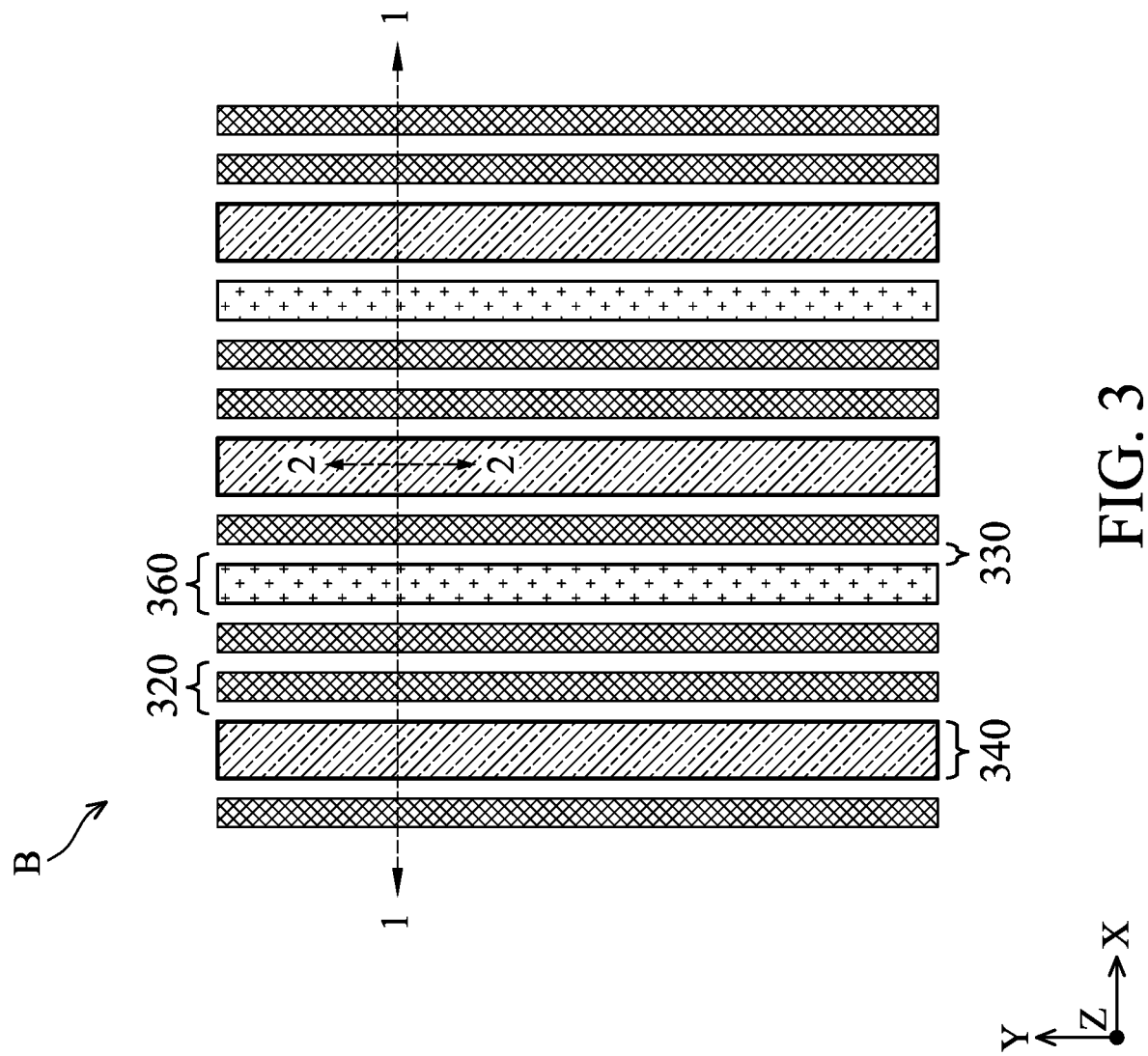

FIG. 3 is a zoomed-in top plan view of the area B in the seal ring region 300 shown in FIG. 1. The seal ring region 300 includes fin-like structures 320 disposed lengthwise along Y direction, isolation structures 330 disposed between and separating the fin-like structures 320, gate-like structures 340 disposed lengthwise along Y direction, and contact structures 360 disposed over the fin-like structures 320 and lengthwise along Y direction. Referring back to FIG. 1, each of the fin-like structures 320, the gate-like structures 340, the contact structures 360, and the isolation structures 330 forms a continuous ring shape completely surrounding the circuit region 200, and thereby may be referred to as fin rings 320, gate rings 340, contact rings 360, and isolation rings 330 hereafter. Each of the fin rings 320, the gate rings 340, the contact rings 360, and the isolation rings 330 encloses (or completely surrounds) the circuit region 200 concentrically and extends substantially parallel to each other.

The seal ring region 300 may include components of FinFET transistors, components of GAA transistors, other types of transistors, and combinations thereof. The components of transistors in the seal ring region 300 are formed simultaneously with the transistors in the device region and are consistent with the device region in types. For example, the seal ring region includes components similar and corresponding to those in FinFET transistors if the circuit region includes FinFET transistors. In another example, the seal ring region includes components similar and corresponding to those in GAA transistors if the circuit region includes GAA transistors. Cross-sectional views of the seal ring region 300 including FinFET-like components are discussed in conjunction with FIGS. 4-9. Similarly, cross-sectional views of the seal ring region 300 including GAA-like transistors are discussed in conjunction with FIGS. 10-16.

Figure 4:
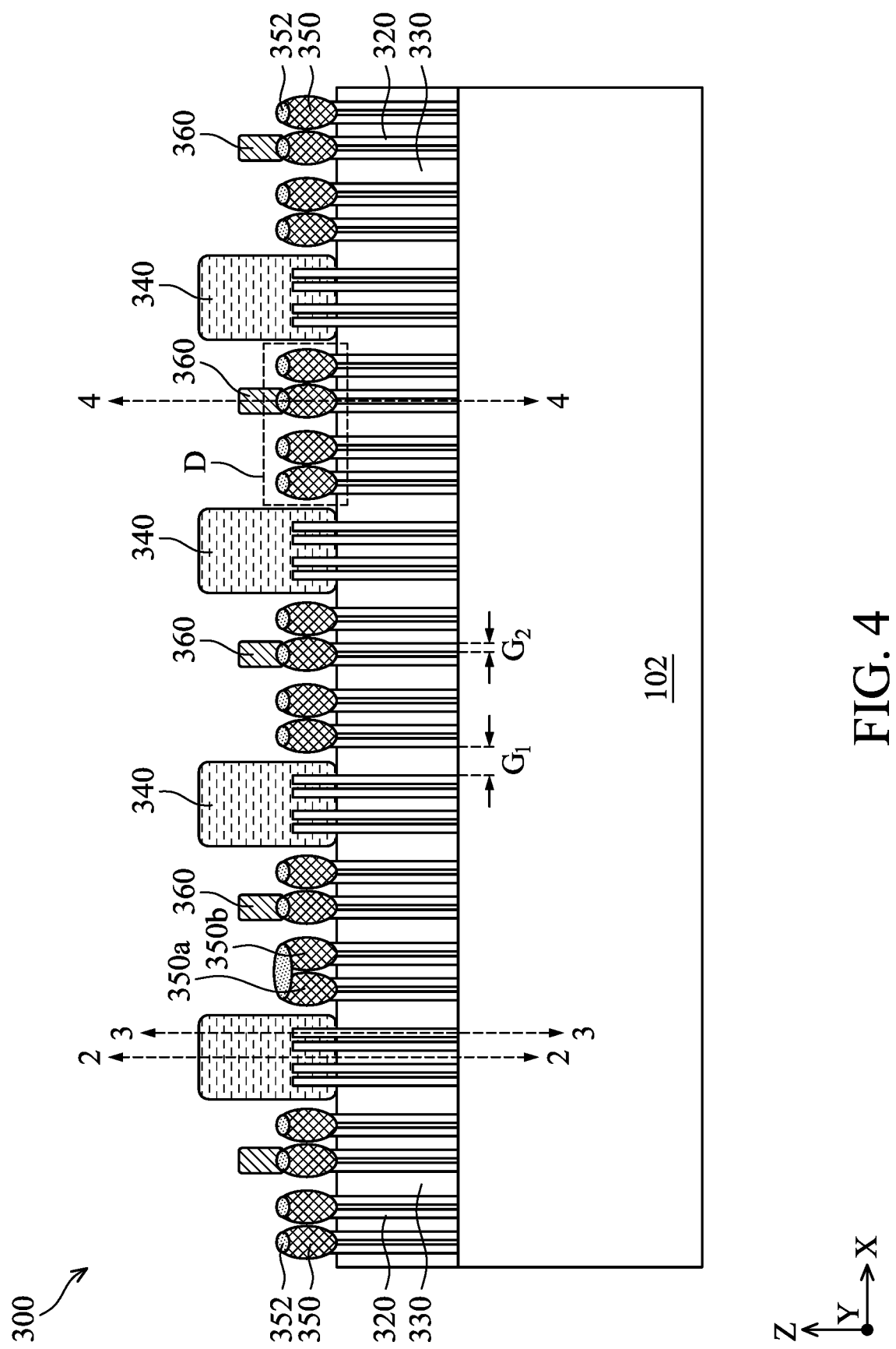
FIG. 4 is a cross-sectional view of the semiconductor structure in FIG. 1 along line "1-1" in FIGS. 1 and 3, according to various embodiments of the present disclosure.

FIG. 4 is a cross-sectional view of the semiconductor structure 100 in the seal ring region 300 along line "1-1" as shown in FIGS. 1 and 3, where the seal ring region 300 includes FinFET-like components. The fin rings 320 protrude from a semiconductor substrate 102 in pairs and are substantially parallel to each other along the Z direction. Both the gaps $G_1$ between pairs of fin rings 320 and the gaps $G_2$ between the two fin rings 320 of each pairs may vary along the X direction in the seal ring region 300. In the present embodiments, the seal ring region 300 has a uniform gap $G_1$ between pairs of fin rings 320 and a uniform gap $G_2$ between two fin rings in each pairs, where $G_1$ is greater than $G_2$. The fin rings 320 may include silicon, germanium, silicon germanium, or other suitable semiconductor materials.

Figure 5:
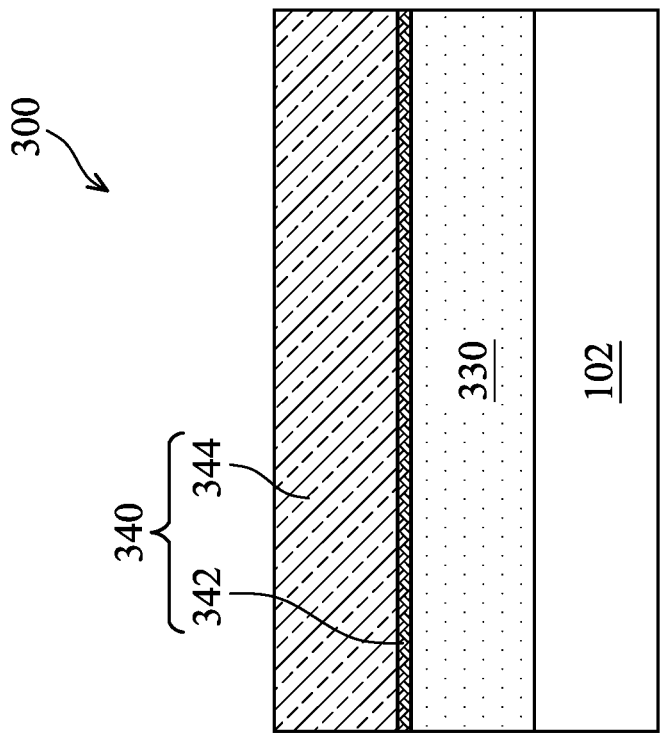
FIGS. 5 and 6 are cross-sectional views of the semiconductor structure in FIG. 1 along lines "2-2" and "3-3" in FIGS. 1, 3, and 4, respectively, according to various embodiments of the present disclosure.
Figure 6:
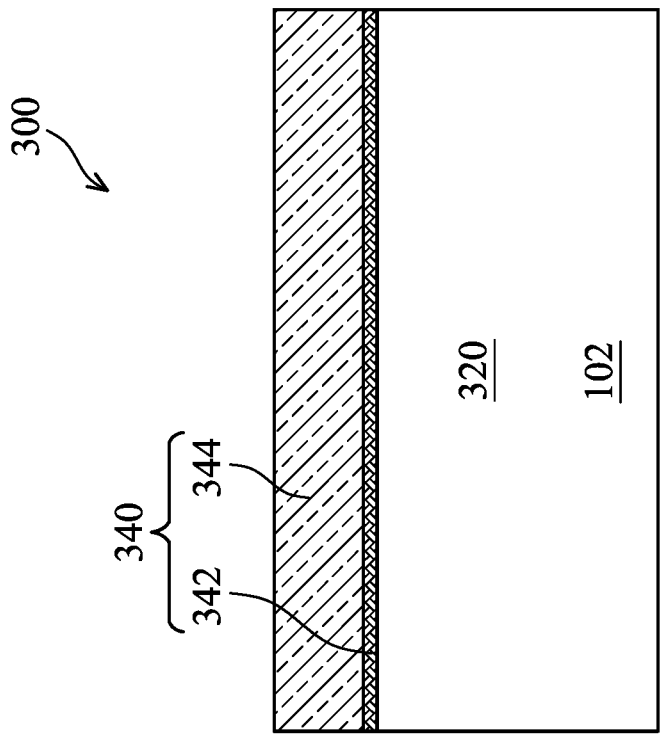

The semiconductor structure 100 further includes the gate rings 340 disposed over the fin rings 320 in the seal ring region 300. Each of the gate rings 340 forms a substantial ring shape extending parallelly to the fin rings 320 and enclosing the circuit region 200. Each of the gate rings 340 are formed over one or more fin rings 320. In some embodiments, the gate rings 340 are formed over one or more pairs of fin rings 320. For example, the gate rings 340 are formed over two pairs of fin rings 320 in the embodiments depicted in FIG. 4. A width of each gate ring 340 is wider than a width of each fin ring 320. As a result, the gate rings 340 covers the fin rings 320 disposed thereunder as shown in FIGS. 3 and 4. As shown in FIGS. 5 and 6, each of the gate rings 340 includes a gate electrode 344 and a gate dielectric layer 342 disposed between and separating the fin rings 320 and the gate electrode 344. The gate electrode 344 may include W, TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The gate dielectric layer 242 may include high-K dielectric materials such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

As shown in FIG. 5, the gate dielectric layer 342 contacts a top surface of the fin rings 320 in a cross-sectional view of the seal ring region 300 along the "2-2" line as shown in FIGS. 1, 3, and 4. As shown in FIG. 6, the gate dielectric layer 342 contacts a top surface of the isolation structure 330 in a cross-sectional view of the seal ring region 300 along the "3-3" line shown in FIG. 4. In one embodiment, the gate dielectric layer 342 may include a dielectric material such as hafnium oxide ($HfO_2$), and may be formed by chemical oxidation, thermal oxidation, atomic layer deposition (ALD), chemical vapor deposition (CVD), and/or other suitable methods. The gate electrode 344 may include a single layer or multilayer structure and may include TiN, TaN, TiAl, or W.

Referring back to FIG. 4, the semiconductor structure 100 further includes epitaxial structures 350 disposed over the fin rings 320 in the seal ring region 300. The epitaxial structures 350 and the gate rings 340 are disposed over different fin rings 320 or different groups of fin rings 320. Each of the epitaxial structures 350 forms a substantial ring shape enclosing the circuit region 200, and therefore are referred to as epitaxial rings 350 hereafter. Each of the epitaxial rings 350 extends parallelly to the fin rings 320 around the entire circuit region 200.

All the epitaxial rings 350 in the seal ring region include a same material. For example, all epitaxial rings 350 in the seal ring region 300 are p-type epitaxial rings. In another example, all epitaxial rings 350 in the seal ring region 300 are n-type epitaxial rings. In a further example, all the epitaxial rings 350 in the seal ring region 300 are non-doped epitaxial rings. The p-type epitaxial material may include silicon germanium (epi SiGe), where the silicon germanium is doped with a p-type dopant such as boron, gallium, indium, and/or other p-type dopants. The n-type epitaxial material may include silicon (epi Si) or silicon carbon (epi SiC), where the silicon or silicon carbon is doped with an n-type dopant such as arsenic, phosphorus, and/or other n-type dopant. The un-doped epitaxial rings may include silicon germanium, silicon, or silicon carbon without any dopant. Unlike the epitaxial structures in the circuit region 200, the epitaxial rings 350 in the seal ring region 300 do not function electronically as active components of transistors. Instead, the epitaxial rings 350 are portions of the seal ring structure 302 serving the purpose of protecting the circuit region 200 from damages of dust, moisture, mechanical stress, and/or other sources of damages. Using the same material for all the epitaxial rings 350 in the seal ring region 300 prevents unintended damages that may occur if different materials are used among epitaxial rings 350, without affecting the functionalities of the epitaxial rings 350 as a portion of the seal ring structures 302.

Figure 9:
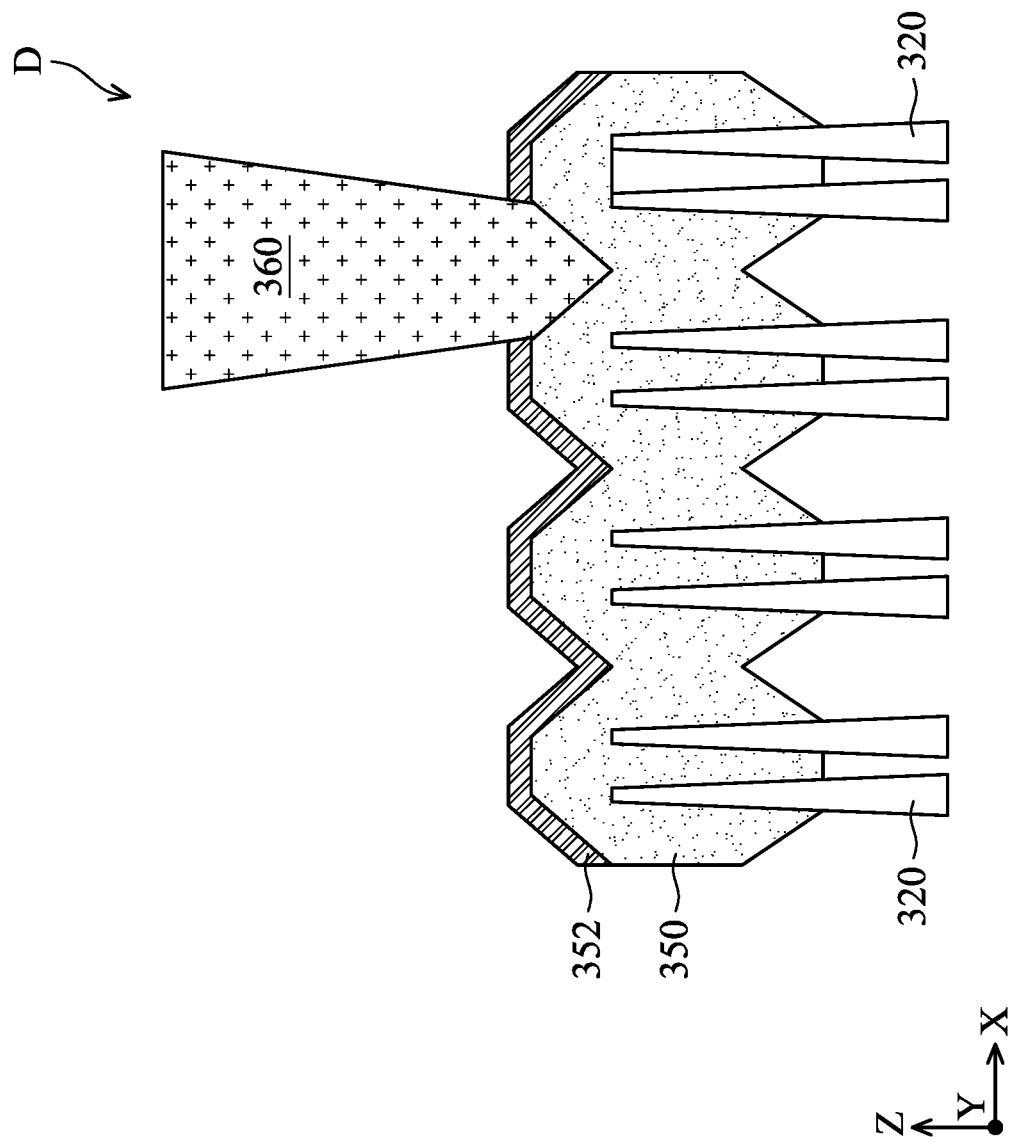
FIG. 9 is a zoomed-in cross-sectional view of the area "D" of FIG. 4 according to various embodiments of the present disclosure.

Each of the epitaxial rings 350 are formed over one or more fin rings 320. For example, the epitaxial rings 350 are formed over a pair of fin rings 320 in the embodiments depicted in FIG. 4. The epitaxial rings 350 may be separated from or merged together with each other, or a combination thereof. For example, epitaxial ring 350a disposed over a first pair of fin rings 320 is merged together with epitaxial ring 350b disposed over a second pair of fin rings 320, where the second pair of fin rings 320 is adjacent to the first pair of fin rings 320 (FIG. 4). Two merged epitaxial rings 350 are also referred to as epitaxial pairs 350. Adjacent epitaxial pairs 350 may be further merged together as depicted in FIG. 9.

Figure 7:
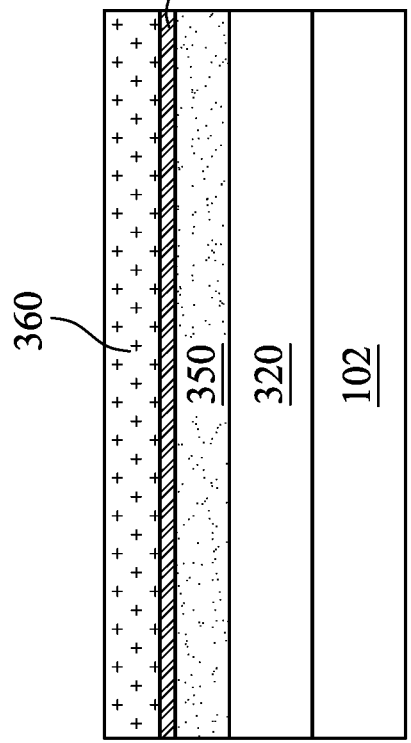

Still referring to FIG. 4, the semiconductor structure 100 further includes silicide layers 352 disposed over the epitaxial rings 350. Each of the silicide layers 352 forms a substantial ring shape enclosing the circuit region 200 in the seal ring region, and therefore is referred to as silicide ring 352 hereafter. In at least some embodiments, the silicide rings 352 are substantially parallel to the epitaxial rings 350 and surround the entire circuit region 200. In some embodiments, the silicide rings 352 are disposed over individual epitaxial rings 350 and are separated from each other. In alternative embodiments, the silicide rings 352 are disposed over the merged epitaxial rings 350 as shown in FIG. 7 to form merged silicide rings 352. The silicide rings 350 may include nickel silicide, cobalt silicide, tungsten silicide, tantalum silicide, titanium silicide, platinum silicide, erbium silicide, palladium silicide, other suitable silicide, or combinations thereof.

Figure 8:
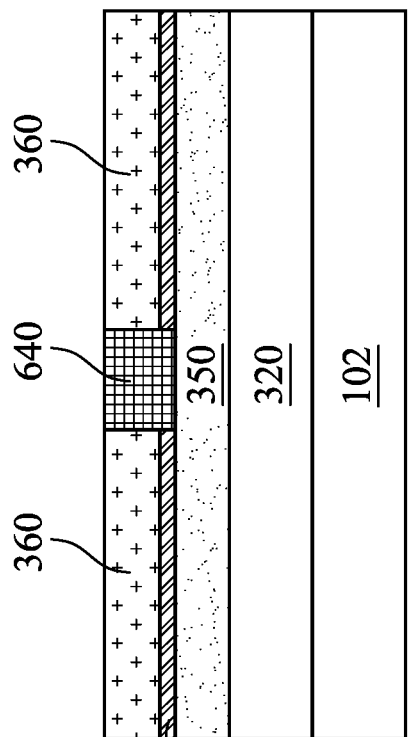
FIGS. 7 and 8 are cross-sectional views of the semiconductor structure in FIG. 1 along line "4-4" in FIG. 4, according to various embodiments of the present disclosure.

The semiconductor structure 100 further includes contact structures 360 disposed over the silicide ring 352. While the epitaxial rings 350 may be of continuous ring shapes to surround the circuit region 200, the contact structures 360 may or may not form continuous rings to enclose the circuit region 200. FIGS. 7 and 8 illustrate cross-sections along the "4-4" line to illustrate continuous and segmented contact structures 360. In some embodiments represented in FIG. 7, each of the contact structures 360 forms a substantial ring shape in the seal ring region enclosing the circuit region 200, and therefore may be referred to as contact rings 360 hereafter. The contact rings 360 may land on (with silicide rings 352 therebetween if present) a single epitaxial ring 350 as shown in FIG. 7 or on merged epitaxial rings 350 as shown in FIG. 9. The contact rings 360 connect the epitaxial ring 350 (through the silicide layers 252 if present) to the later formed portions of the seal ring structure 302 in BEOL. The contact rings 360 may include any suitable conductive material, such as Co, W, Ru, Cu, Al, Ti, Ni, Au, Pt, Pd, TiN, TaN, Ta, and/or other suitable conductive materials. In some embodiments represented in FIG. 8, each of the contact structures 360 is divided by a plurality of interlayer dielectric (ILD) features 640 and becomes segmented (non-continuous). In the depicted embodiment, the ILD feature 640 extends into the silicide ring 352 and separates the silicide ring 352 into different segments. In other embodiments, the ILD feature 640 does not extend all the way through the silicide ring 352, leaving the silicide ring 352 substantially intact.

Still referring to FIG. 4, the fin rings 320, the isolation rings 330, the gate rings 340, the epitaxial rings 350, and the contact rings 360 are disposed alternately along the X direction in the seal ring region 300. The numbers of the epitaxial rings 350 and the numbers of the contact rings 360 disposed between two adjacent gate rings 340 may vary along the X direction in the seal ring region 300. For example, in the depicted embodiments as shown in FIG. 4, four pairs of the fin rings (eight fin rings) 320 and one of the contact rings 360 are disposed between two adjacent gate rings 340. Such configuration improves processability and the seal ring stability. For example, the intervals of the gate rings 340, the epitaxial rings 350, and the contact rings 360 are configured to match the pattern density in the circuit region to improve topography and to avoid dishing in subsequent chemical mechanical polarization processes. The multiple epitaxial rings 350 between two adjacent gate rings 340, especially when merged together, provide improved landing surface and stability for the contact rings 360.

Figure 10:
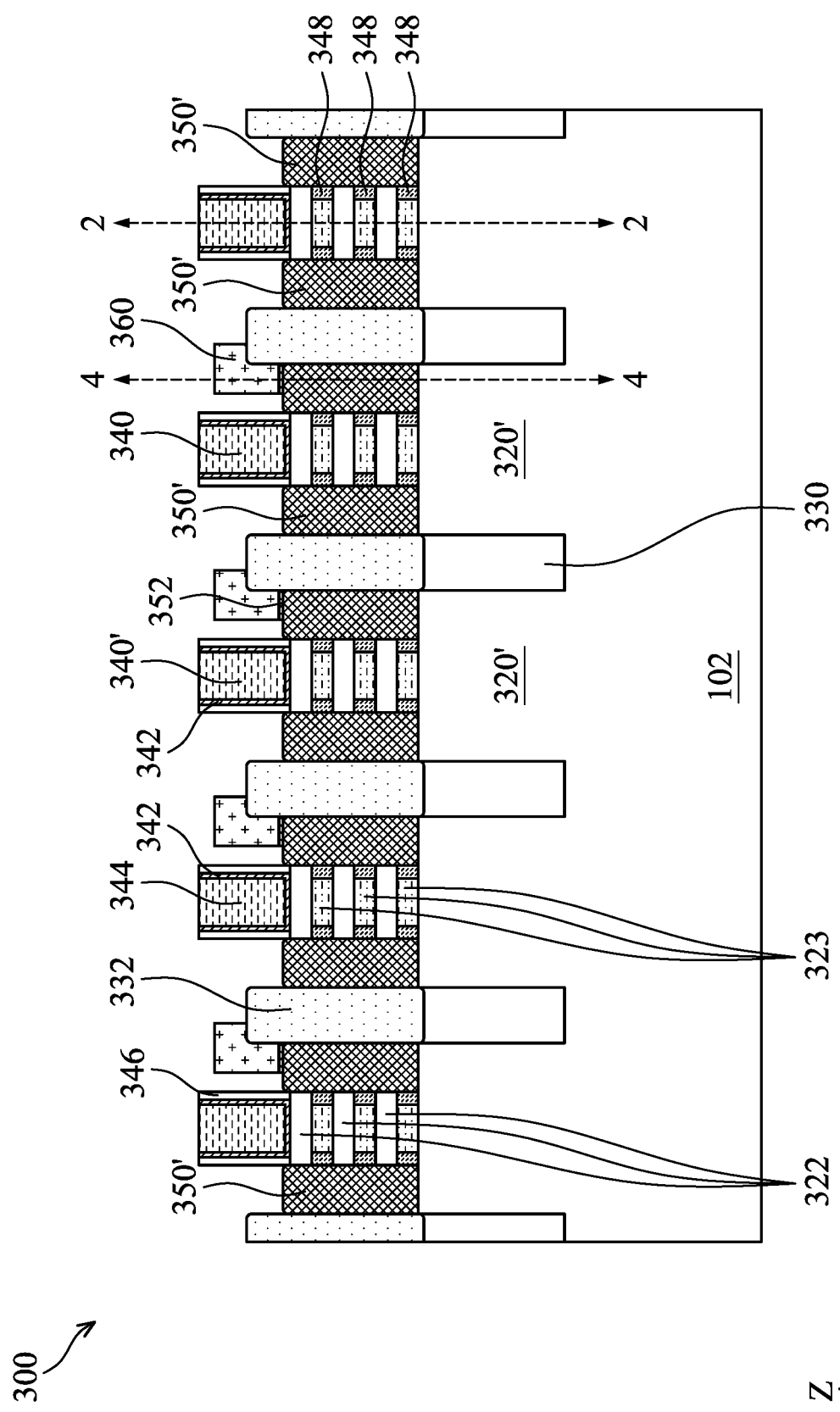
FIG. 10 is a cross-sectional view of the semiconductor structure in FIG. 1 along line "1-1", according to embodiments of the present disclosure alternative to the embodiments shown in FIGS. 4-9.
Figure 11:
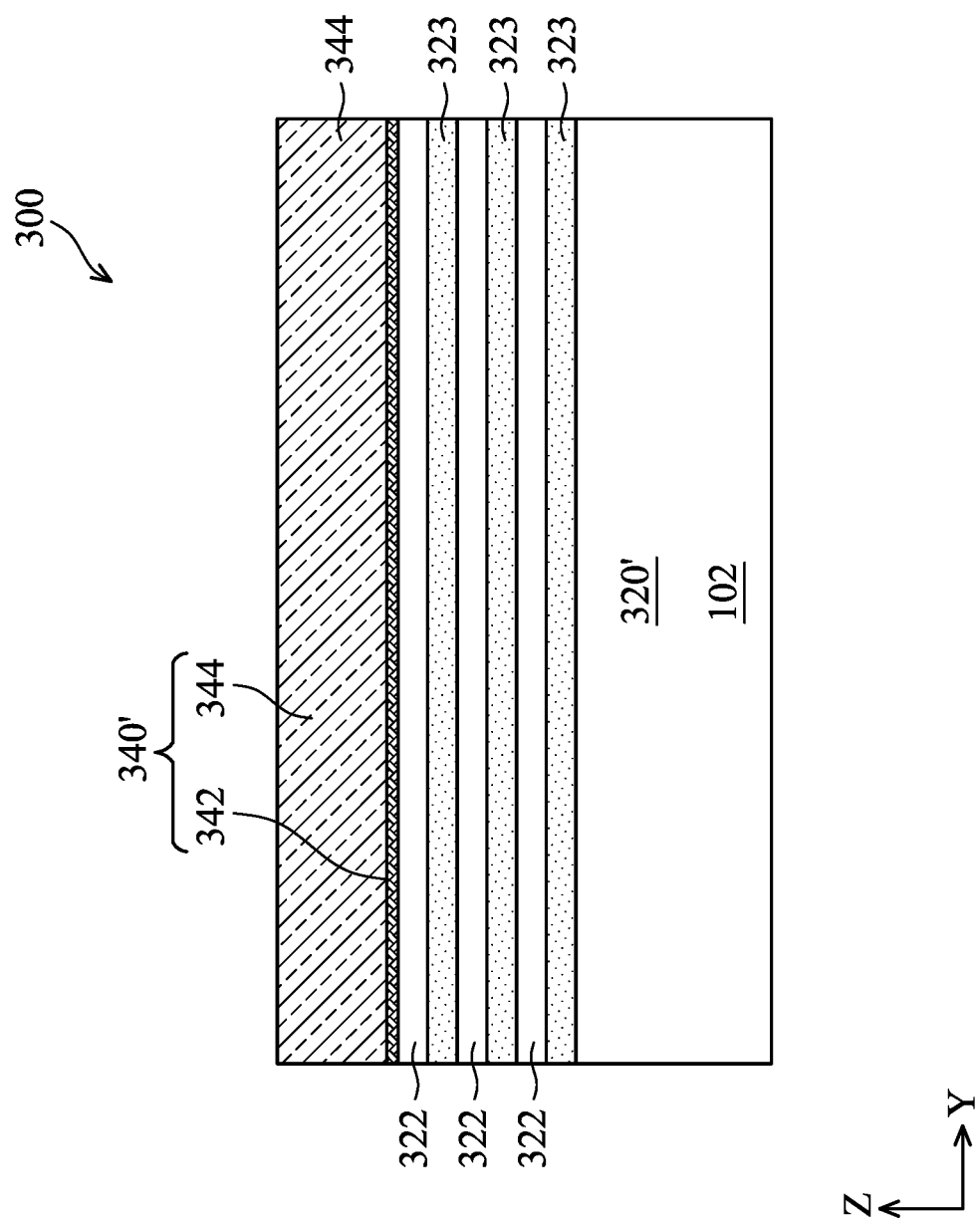
FIG. 11 is a cross-sectional view of the semiconductor structure in FIG. 1 along line "2-2" in FIGS. 1 and 10, according to various embodiments of the present disclosure.

FIGS. 10 and 11 are cross-sectional views of the semiconductor structure 100 in the seal ring region 300 along lines "1-1" and the "2-2" as shown in FIGS. 1 and 10, where the seal ring region 300 includes GAA-like components. The fins (active regions) of the GAA transistors are formed by alternately stacking first semiconductor layers 322 and second semiconductor layers 323. In some instances, the first semiconductor layers 322 include silicon and the second semiconductor layers 323 include silicon germanium such that the second semiconductor layers 323 may be selectively removed in a channel release process. However, because the gate rings 340 in the seal ring region 300 extend parallel to the fin rings 320', the second semiconductor layers 323 in the fin rings 320' are not selectively removed. As a result, as shown in FIG. 10, both the first semiconductor layers 322 and the second semiconductor layers 323 remain in the fin rings 320'. The embodiments of the seal ring region 300 discussed above with respect to FIGS. 4-9 also applies to the seal ring regions 300 including GAA-like components, except for the aspects explicitly pointed out. As shown in FIG. 10, each of the fin rings 320' is disposed directly between two epitaxial rings 350' along the X direction.

As depicted in FIGS. 10 and 11, the seal ring region 300 includes GAA-like components. In the embodiments depicted in FIG. 10, each of the gate rings 340' is disposed over one of the fin rings 320', each of which includes the first semiconductor layers 322 interleaved by the second semiconductor layers 323. In some embodiments, not all of the fin rings 320' are disposed below a gate ring 340'. In other words, some of the fin rings 320' may be free of any overlying gate rings 340'. The gate ring 340' includes a gate dielectric layer 342 and a gate electrode 344. The gate dielectric layer 342 separates the gate electrode 344 from a top surface of the topmost first semiconductor layer 322 of the fin rings 320'. The semiconductor structure 100 further includes gate spacers 346 and inner spacers 348 disposed on sidewall of the gate ring 340'. The inner spacer separates the second semiconductor layers 323 from the epitaxial rings 350', although the two do not have electrical functions.

The seal ring region 300 further includes dummy fin rings 332 are disposed between the fin rings 320' and around the circuit region 200 to provide isolation and to adjust distances between the fin rings 320'. The epitaxial rings 350' are also disposed between the fin rings 320' and the dummy fin rings 332. All epitaxial rings 350' in the seal ring region 300 are formed of the same material to avoid inadvertent damage brought by the forming of epitaxial rings 350' including more than one material.

Figure 13:
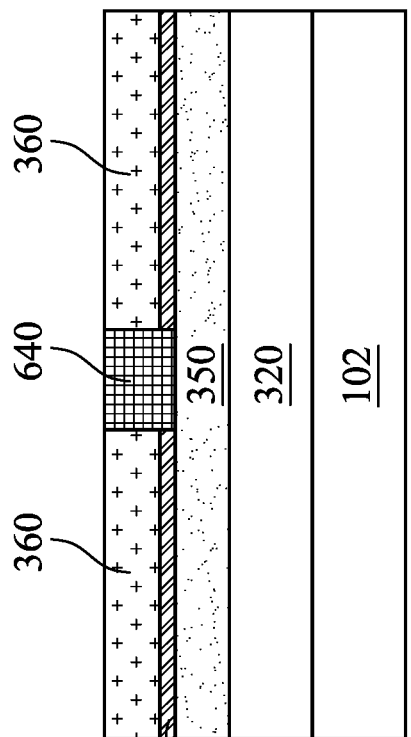
FIGS. 12 and 13 are cross-sectional views of the semiconductor structure in FIG. 1 along line "4-4" in FIG. 10, according to various embodiments of the present disclosure.
Figure 12:
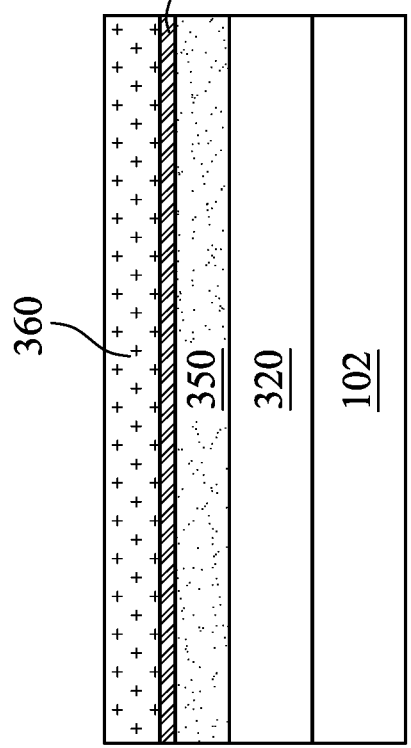

The seal ring region 300 shown in FIG. 10 also includes contact structures 360, each of which is disposed at least partially over an epitaxial ring 350'. In some the embodiments represented in FIG. 10, each of the contact structures 360 is disposed over an epitaxial ring 350' and a dummy fin ring 332. In some implementations, a silicide ring 352 may be disposed between an epitaxial ring 350' and a contact structure 360. While the epitaxial rings 350 may be of continuous ring shapes to surround the circuit region 200, the contact structures 360 may or may not form continuous rings to enclose the circuit region 200. FIGS. 12 and 13 illustrate cross-sections along the "4-4" line to illustrate continuous and segmented contact structures 360. In some embodiments represented in FIG. 12, each of the contact structures 360 forms a ring shape in the seal ring region enclosing the circuit region 200, and therefore may be referred to as contact rings 360 hereafter. The contact rings 360 connect the epitaxial ring 350 (through the silicide rings 352 if present) to the later formed portions of the seal ring structure 302 in BEOL. The contact rings 360 may include any suitable conductive material, such as Co, W, Ru, Cu, Al, Ti, Ni, Au, Pt, Pd, TiN, TaN, Ta, and/or other suitable conductive materials. In some embodiments represented in FIG. 13, each of the contact structures 360 is divided by a plurality of interlayer dielectric (ILD) features 640 and becomes segmented (non-continuous). In the depicted embodiment, the ILD feature 640 extends into the silicide ring 352 and separates the silicide ring 352 into different segments. In other embodiments, the ILD feature 640 does not extend all the way through the silicide ring 352, leaving the silicide ring 352 substantially intact.

Figure 14:
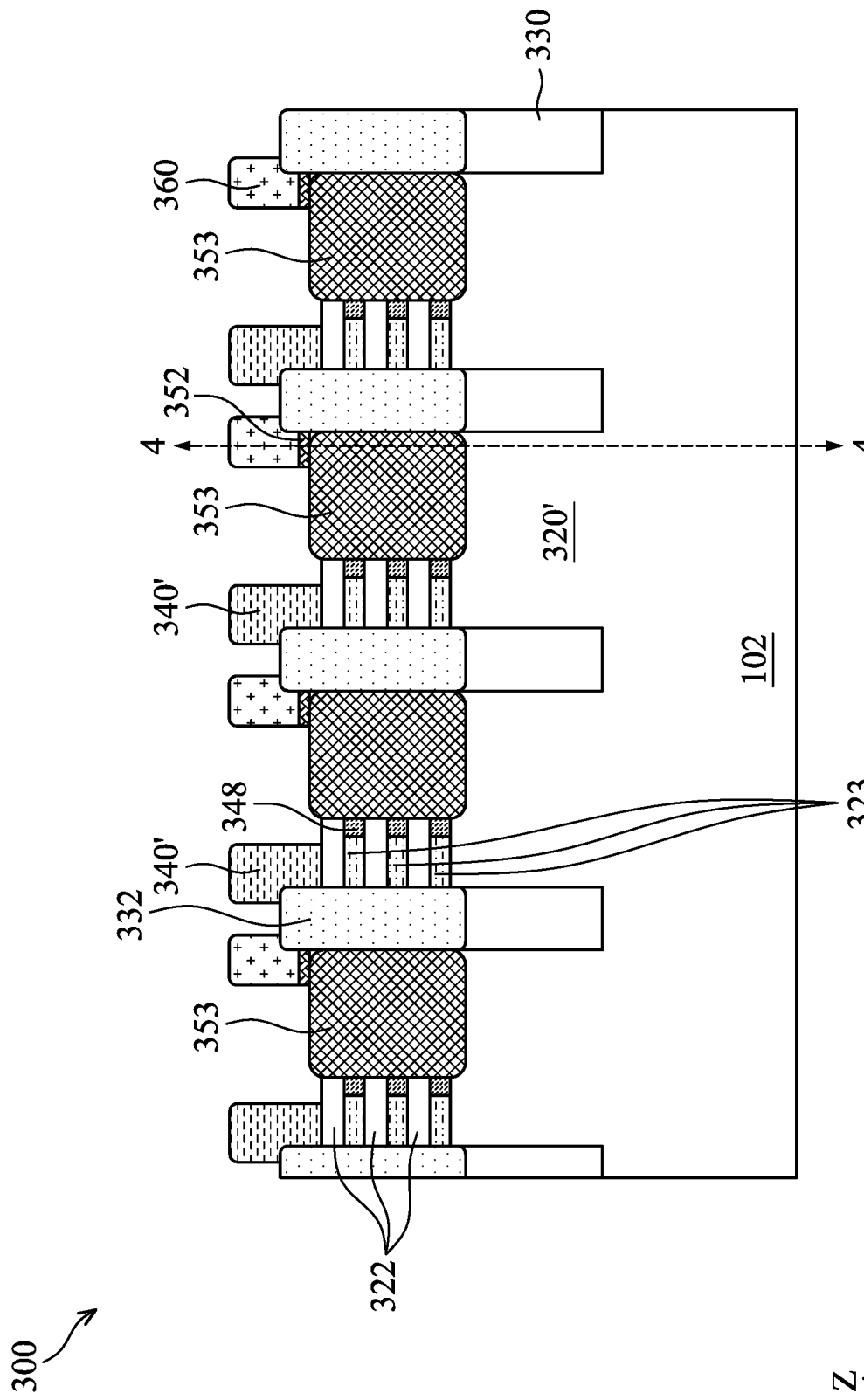
FIG. 14 is a cross-sectional view of the semiconductor structure in FIG. 1 along line "1-1", according to embodiments of the present disclosure alternative to the embodiments shown in FIGS. 4-9.

In some alternative embodiments shown in FIG. 14, each of the fin rings 320' is sandwiched between a dummy fin ring 332 and a lopsided epitaxial ring 353. That is, the fin rings 320' is not sandwiched two epitaxial rings 350'. Because a sidewall of each of the fin rings 320' is pushed all the way to abut a dummy fin ring 332, the inner spacers 348 are only formed adjacent one end of each of the second semiconductor layers 323. In other words, along the X direction, each of the second semiconductor layers 323 is disposed between a dummy fin ring 332 and an inner spacer 348.

Figure 16:
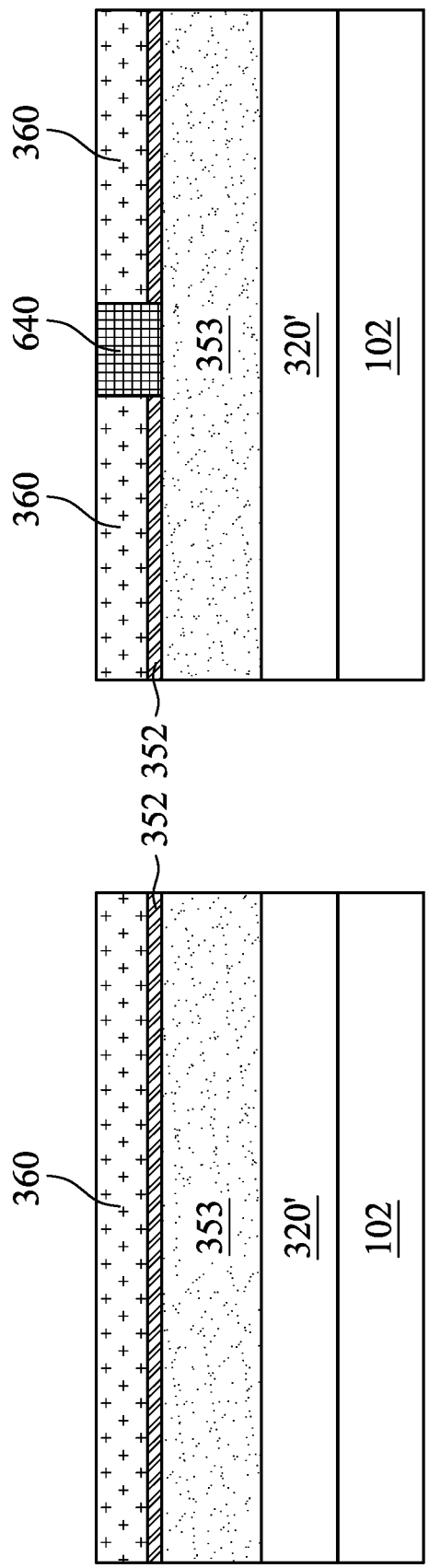
FIGS. 15 and 16 are cross-sectional views of the semiconductor structure in FIG. 1 along line "4-4" in FIG. 14, according to various embodiments of the present disclosure.
Figure 15:

The seal ring region 300 shown in FIG. 14 also includes contact structures 360, each of which is disposed at least partially over a lopsided epitaxial ring 353. In some the embodiments represented in FIG. 14, each of the contact structures 360 is disposed over a lopsided epitaxial ring 353 and a dummy fin ring 332. In some implementations, a silicide ring 352 may be disposed between an epitaxial ring 350' and a contact structure 360. While the lopsided epitaxial rings 353 may be of continuous ring shapes to surround the circuit region 200, the contact structures 360 may or may not form continuous rings to enclose the circuit region 200. FIGS. 15 and 16 illustrate cross-sections along the "4-4" line to illustrate continuous and segmented contact structures 360. In some embodiments represented in FIG. 15, each of the contact structures 360 forms a ring shape in the seal ring region 300 enclosing the circuit region 200, and therefore may be referred to as contact rings 360 hereafter. The contact rings 360 connect the epitaxial ring 350 (through the silicide rings 352 if present) to the later formed portions of the seal ring structure 302 in BEOL. The contact rings 360 may include any suitable conductive material, such as Co, W, Ru, Cu, Al, Ti, Ni, Au, Pt, Pd, TiN, TaN, Ta, and/or other suitable conductive materials. In some embodiments represented in FIG. 16, each of the contact structures 360 is divided by a plurality of interlayer dielectric (ILD) features 640 and becomes segmented (non-continuous). In the depicted embodiment, the ILD feature 640 extends into the silicide ring 352 and separates the silicide ring 352 into different segments. In other embodiments, the ILD feature 640 does not extend all the way through the silicide ring 352, leaving the silicide ring 352 substantially intact.

Figure 17:
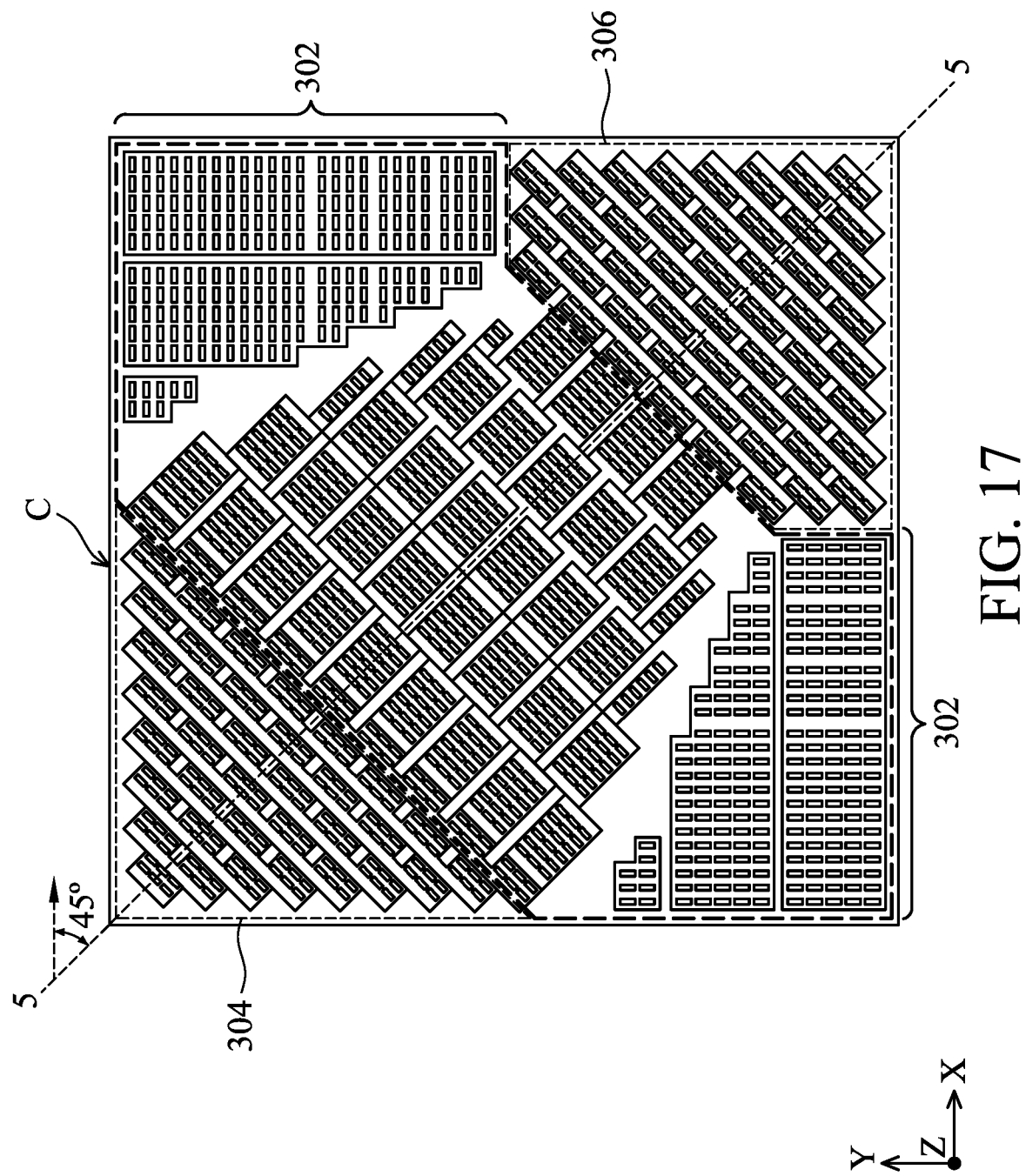
FIG. 17 is a zoomed-in top plan view of the area "C" of FIG. 1 according to various embodiments of the present disclosure.

FIG. 17 illustrates a zoomed-in top plan view of the area C shown in FIG. 1. In the present disclosure, transistor-like components are selectively placed in the outer corner regions 304 and the inner corner regions 306 of the seal ring region 300. The transistor-like components in the seal ring region 300 do not have electrical functions and are formed to reduce process variations, such as dishing issues during subsequent chemical mechanical planarization (CMP) processes or other type of manufacturing processing issues. The outer corner regions 304 and the inner corner regions 306 may include one or more transistor-like components selected from fins 420, isolation structures 430, epitaxial structures 450, silicide layers 452, gate structures 440, contact structures 460, and other suitable components, or combinations thereof. These components are disposed lengthwise in straight lines and substantially parallel to the sloped corner lines, and are therefore also referred to as fins 420, isolation lines 430, epitaxial lines 450, silicide lines 452, gate lines 440, and contact lines 460. The transistor-like components in the outer corner region 304 and the inner corner region 306 are formed simultaneously as their counterparts in the device region 200 and the seal ring region 300. The outer corner regions 304 and the inner corner regions 306 includes transistor-like components similar to those components described above with respect to the device region 200 and the seal ring region 300, except the differences that are explicitly point out.

Figure 18:
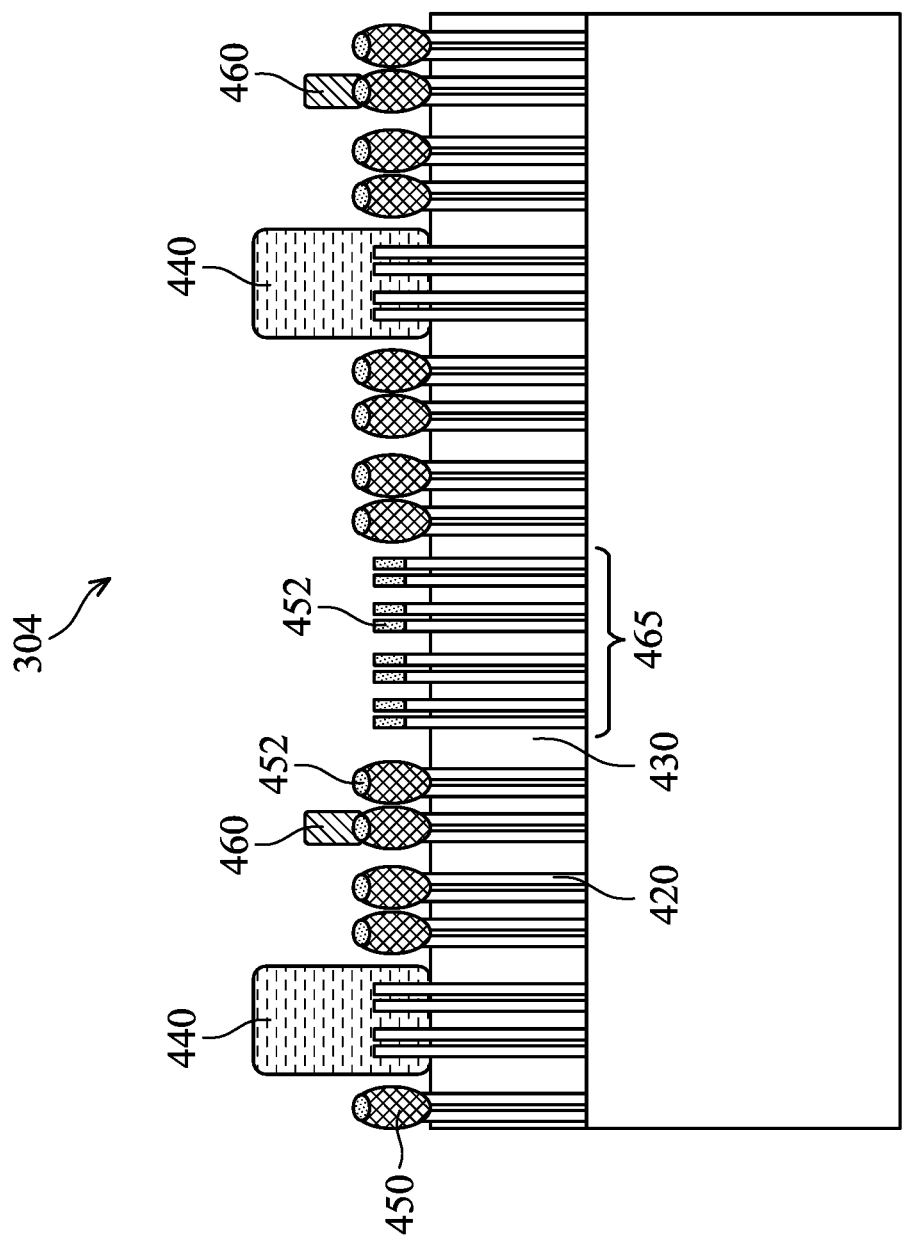
FIGS. 18 and 19 are cross-sectional views of the semiconductor structure in FIG. 1 along line "5-5" in FIG. 17 according to various embodiments of the present disclosure.

FIG. 18 illustrates cross-sectional views of the outer corner region 304 along line "5-5" as shown in FIG. 17. Line "4-4" is a diagonal line of the semiconductor structure 100 that forms a 45° angle with X direction. The outer corner region 304 includes the fins 420, the isolation structures 430, the epitaxial structures 450, the silicide layers 452, and the contact structures 460. The outer corner region 304 has a gap region 465 in which the fins 420 are free from the overlying gate structures 440, the epitaxial structures 450, and the contact structures 460. The gap region 465 includes silicide layer 452 disposed directly over and contacting the fins 420. The silicide layer 452 are formed over the fins 420 simultaneously with the silicide layer 252 in the device region 200 and the silicide ring 352 in the seal ring region 300. The gap region 465 is disposed lengthwise substantially perpendicular to the lengthwise direction of the fins 420. An extension line along the length direction of the gap 465 intersects the fins 420, the gate structures 440 and the epitaxial structures 450, and the silicide layer 452 in the outer corner region 304 (FIG. 4).

Figure 19:
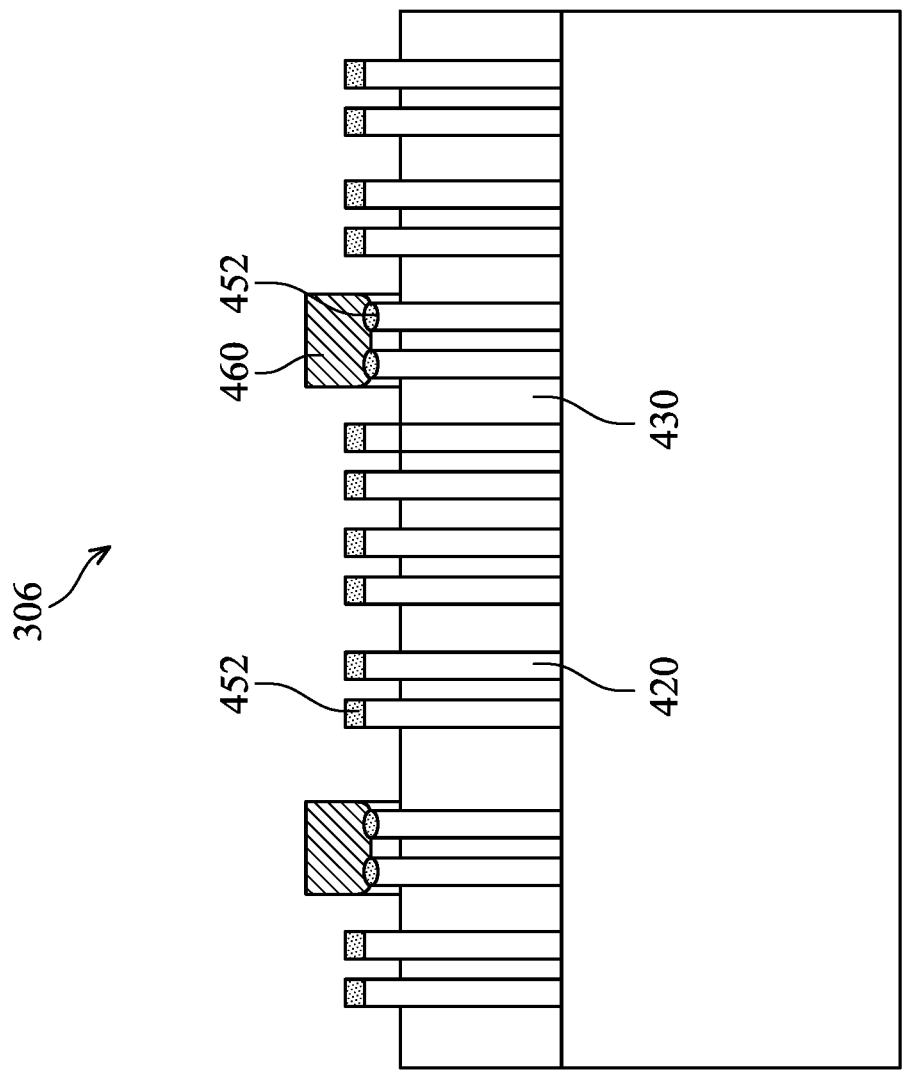

FIG. 19 illustrates cross-sectional views of the inner corner region 306 along the line "5-5" shown in FIG. 17. The inner corner region 306 includes the fins 420, the isolation structures 430, the silicide layers 452, and the contact structures 460. The cross-sectional region of the inner corner region 306 shown in FIG. 19 does not include gate structures 440 and the epitaxial structures 450. Other cross-sectional region of the inner corner region 306 may include gate structures 440 and epitaxial structures 450 similar to those shown in FIG. 18. The silicide layers 452 are deposited directly on and in direct contact with the fins 420. The contact structures 460 are disposed over a portion of the fins 420 (with the silicide layers 452 disposed therebetween if present). A remaining portion of the fins 420 are free from the gate structures 440, the epitaxial structures 450, and the contact structures 460. The outer corners region 304 and the inner corners region 306 are such designed for various mechanical concerns, such as preventing layer peeling at the corner of the chips during dicing processes.

Figure 22:
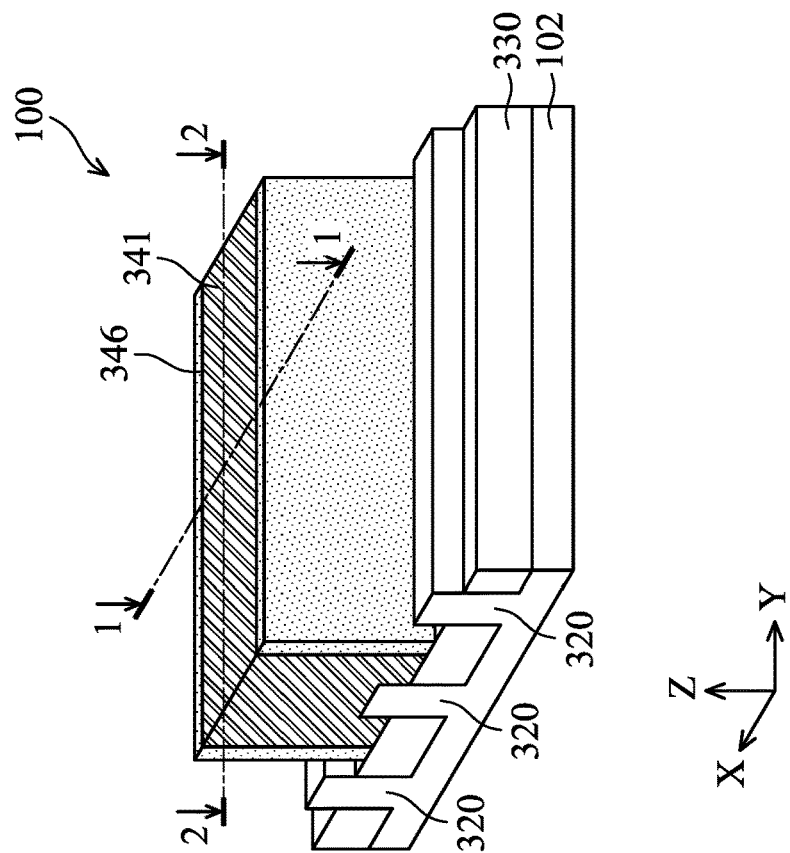
FIG. 22 is three-dimensional perspective view of the region B of the semiconductor structure in FIG. 1 at an intermediate stage of the method shown in FIG. 20, according to various embodiments of the present disclosure.
Figure 21:
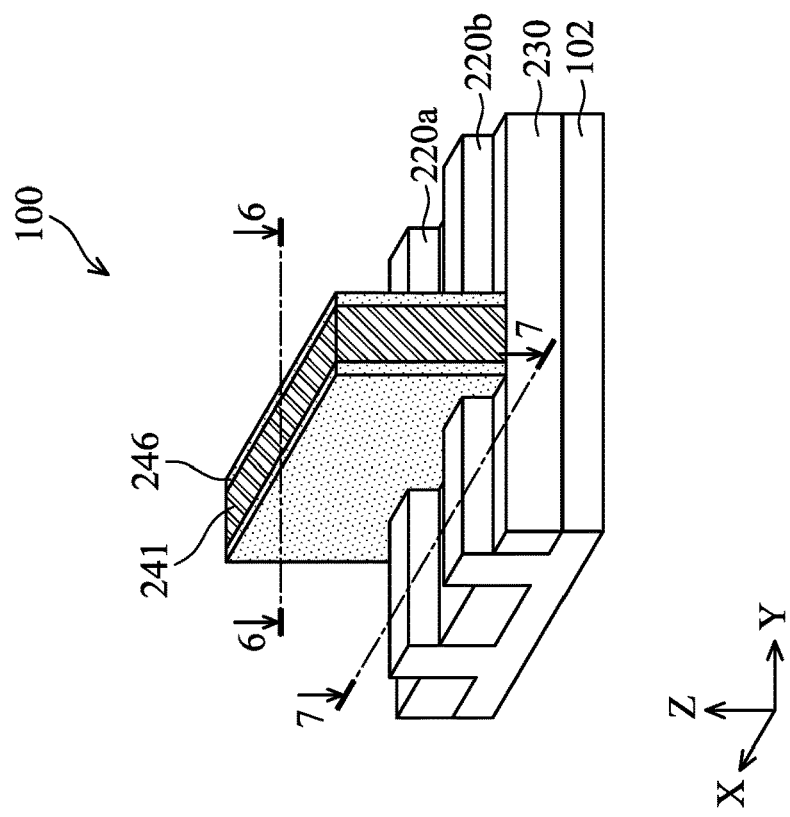
FIG. 21 is a three-dimensional perspective view of the region A of the semiconductor structure in FIG. 1 at an intermediate stage of the method shown in FIG. 20, according to various embodiments of the present disclosure.
Figure 23:
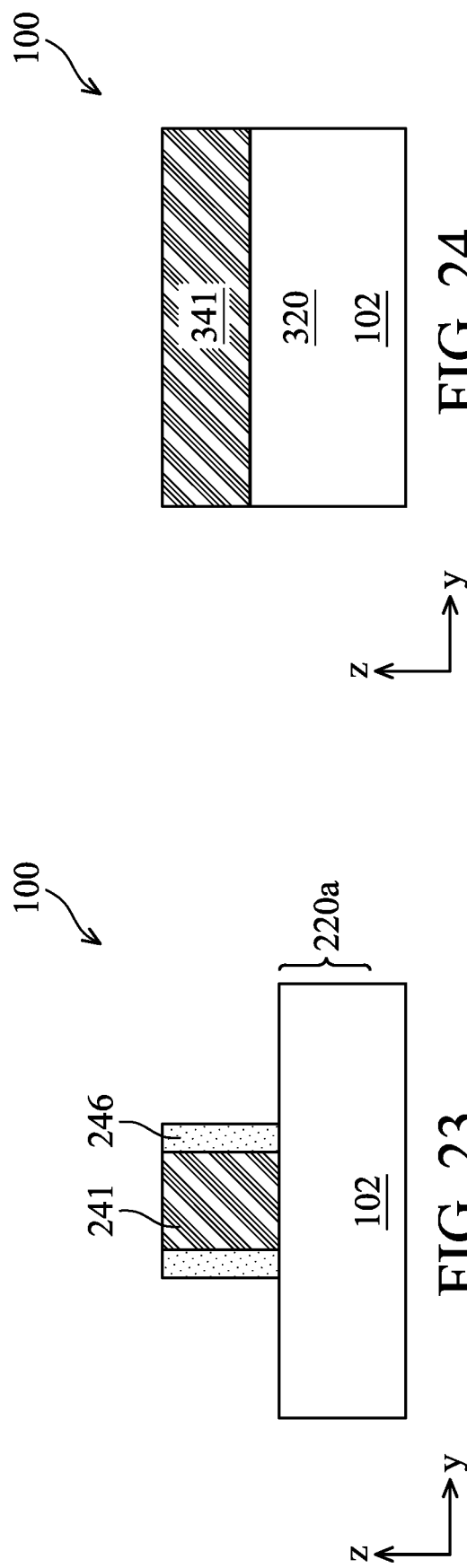
Figure 25:
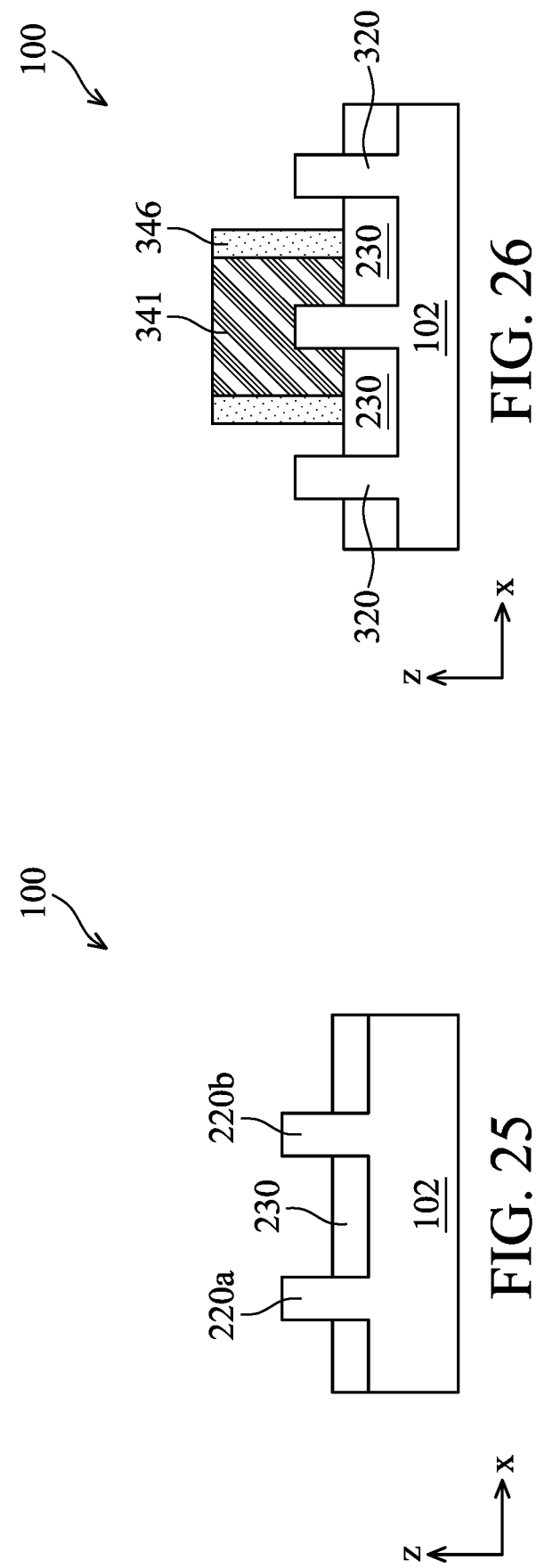
Figure 24:
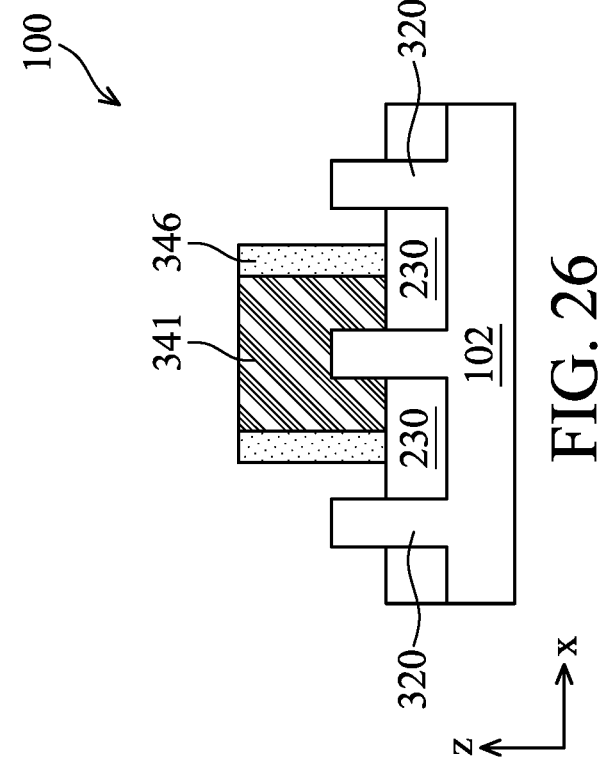
Figure 26:
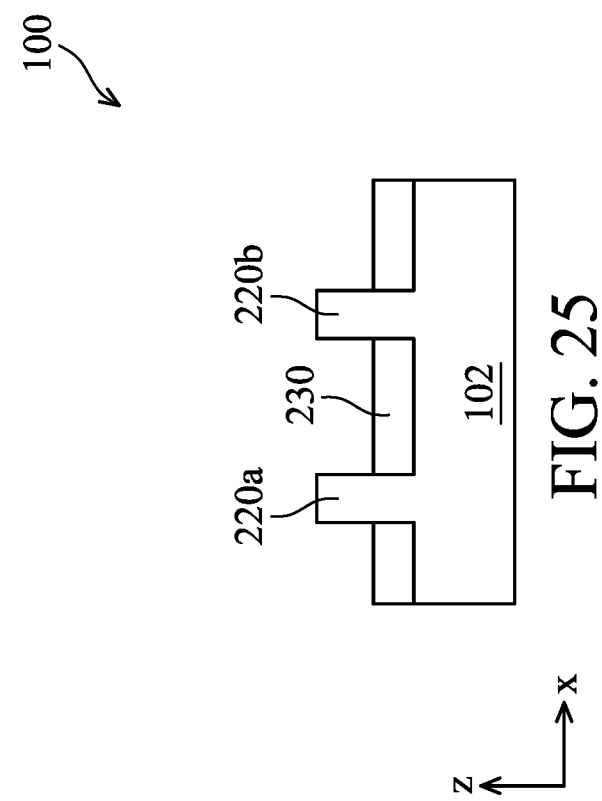
Figure 35:
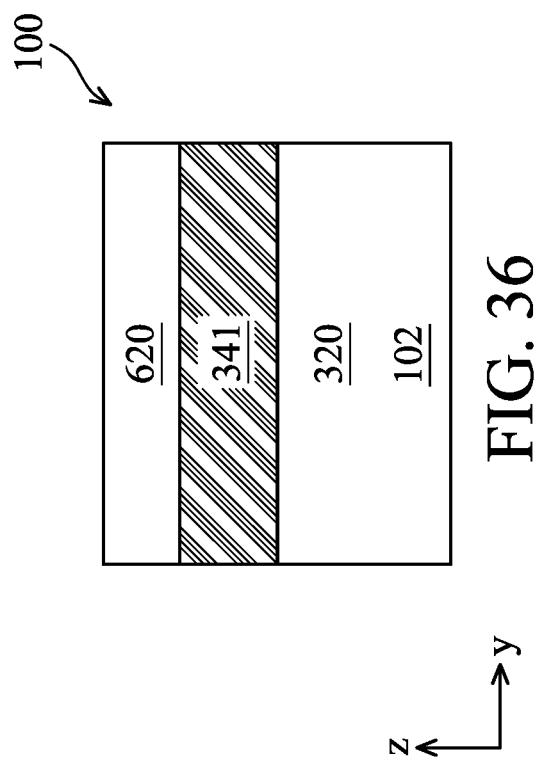
Figure 36:
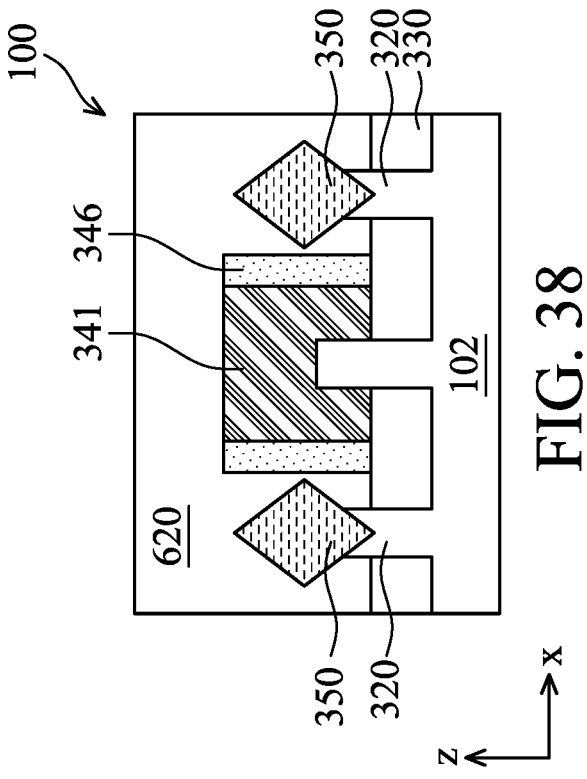
Figure 37:
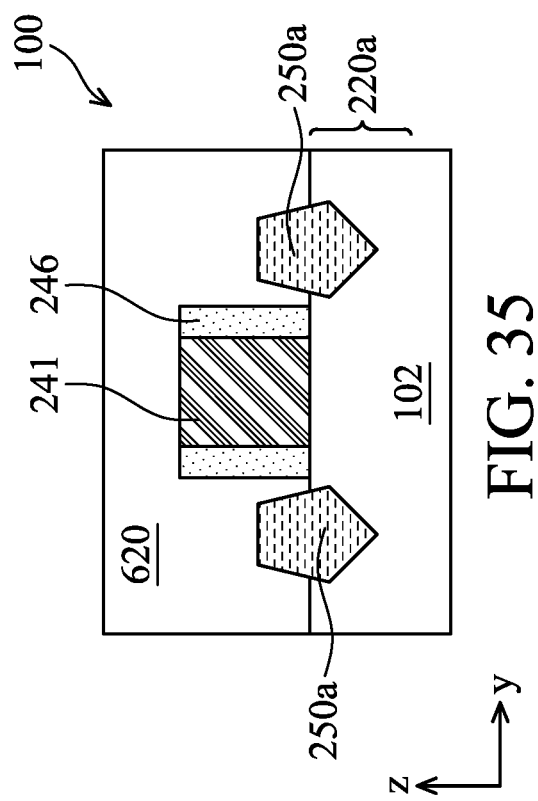
Figure 38:
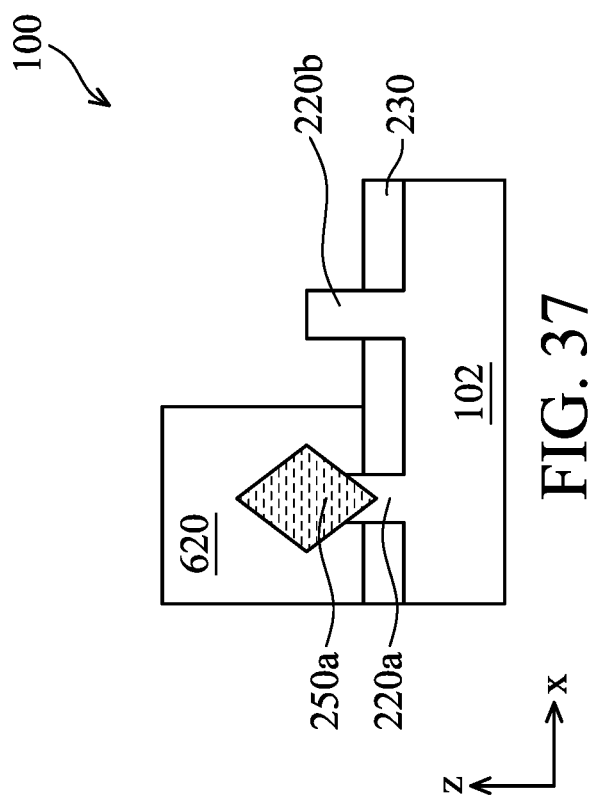
Figure 39:
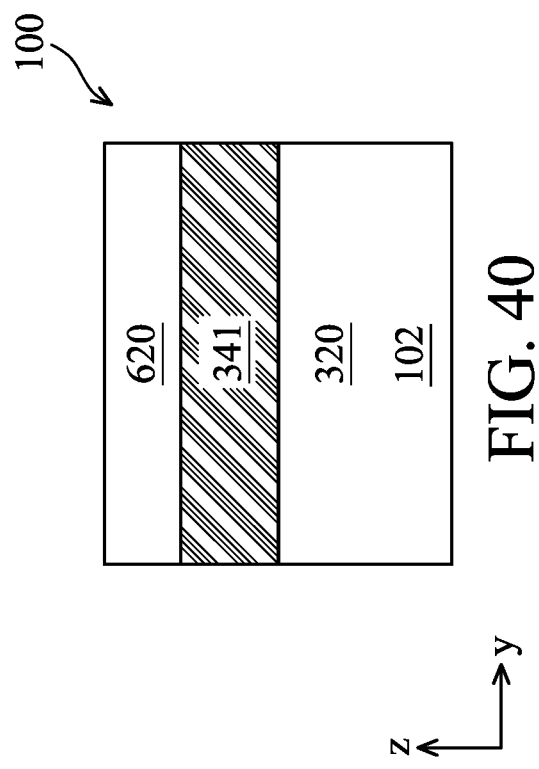
Figure 40:
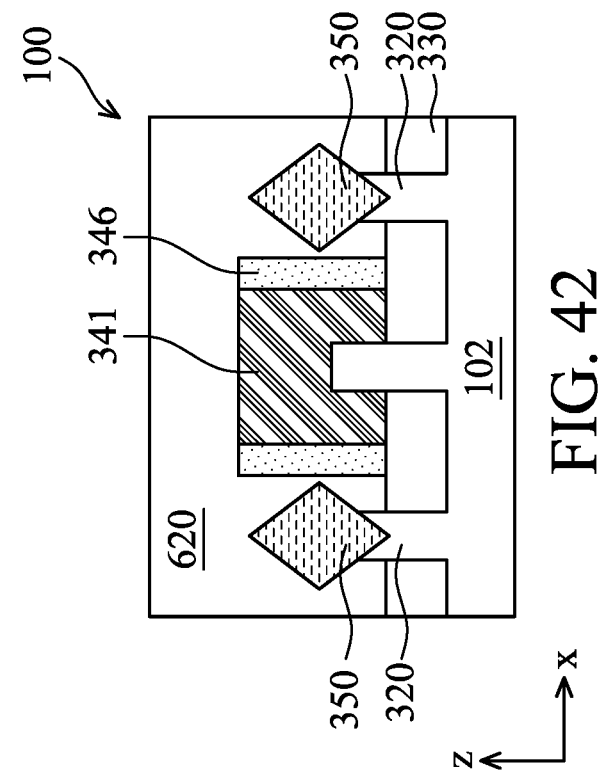
Figure 41:
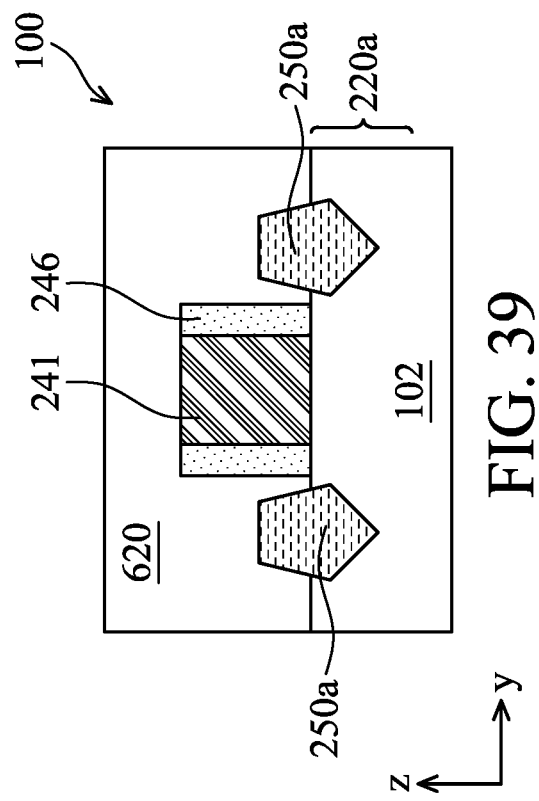
Figure 42:
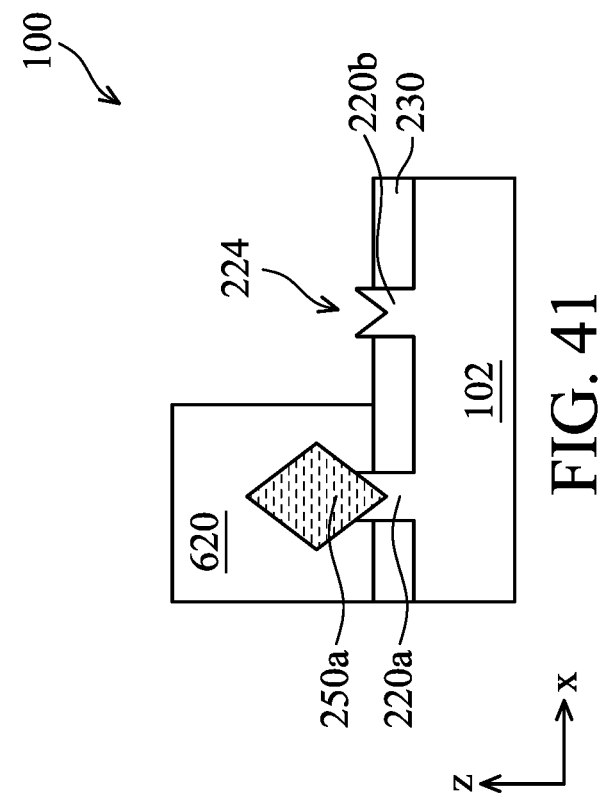
Figure 43:
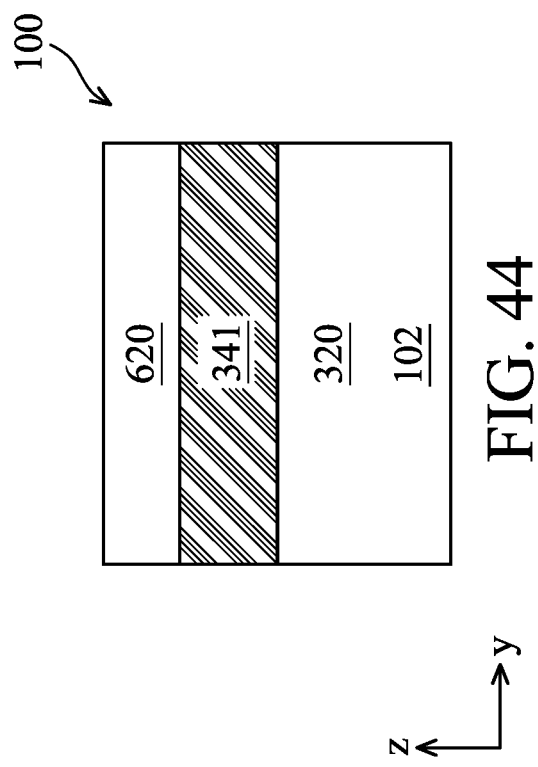
Figure 44:
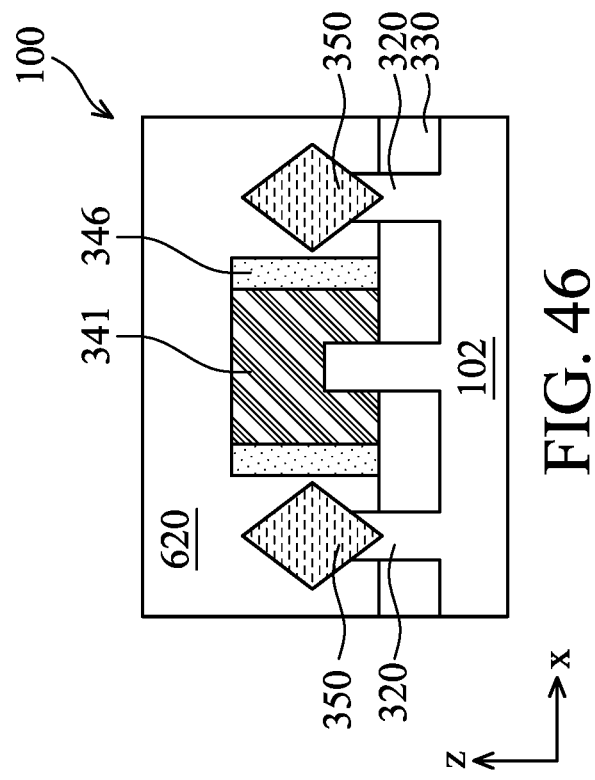
Figure 45:
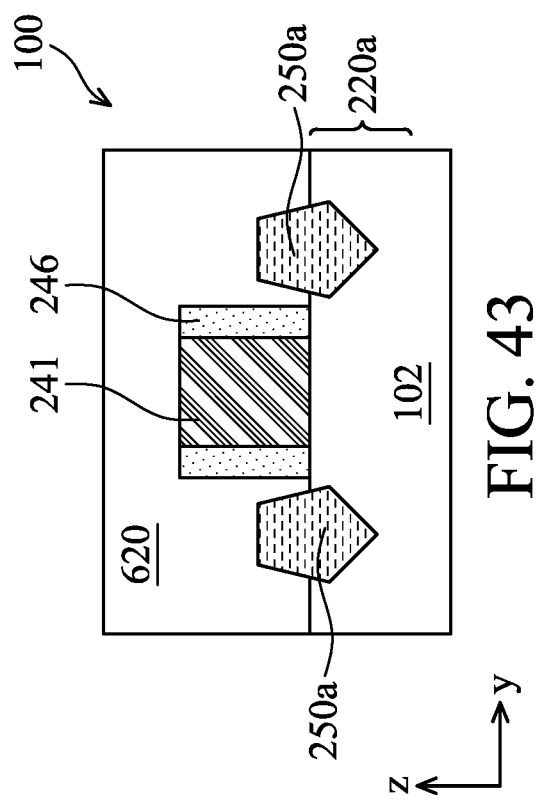
Figure 46:
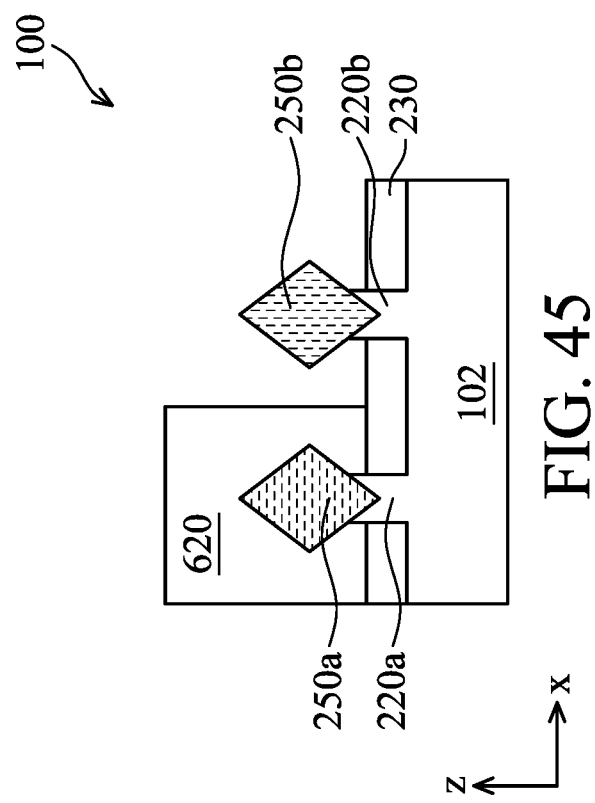
Figure 47:
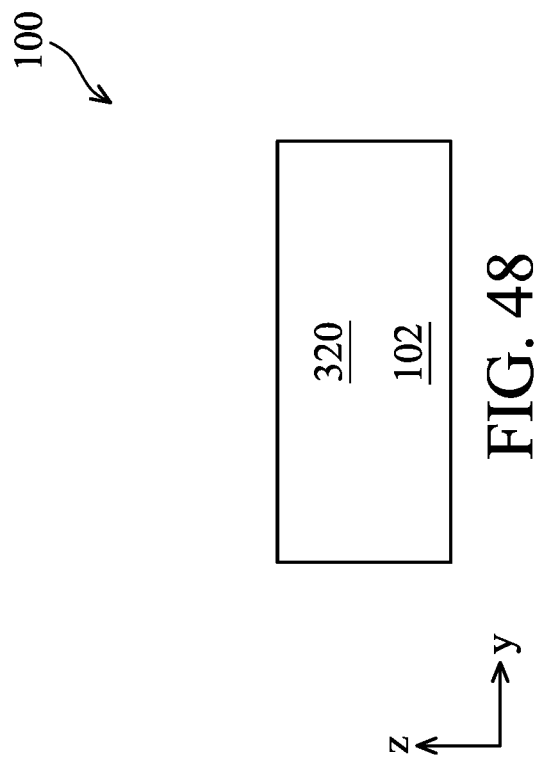
Figure 48:
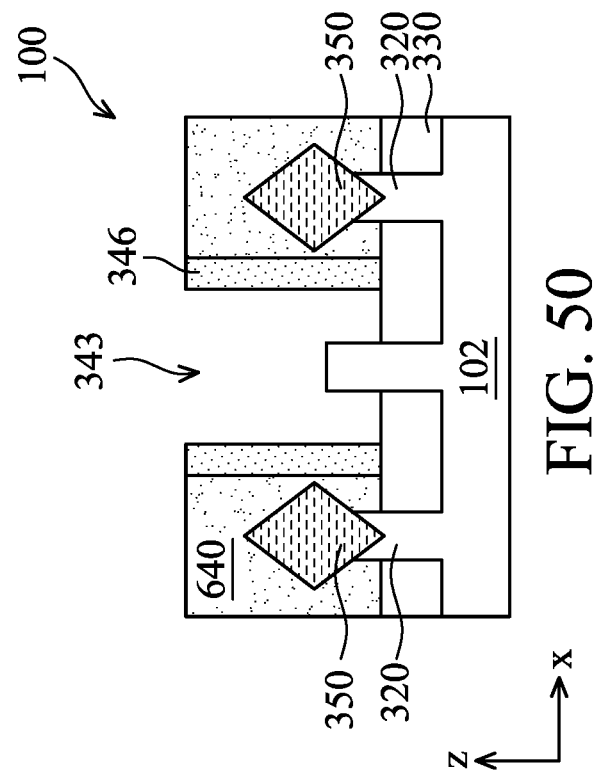
Figure 49:
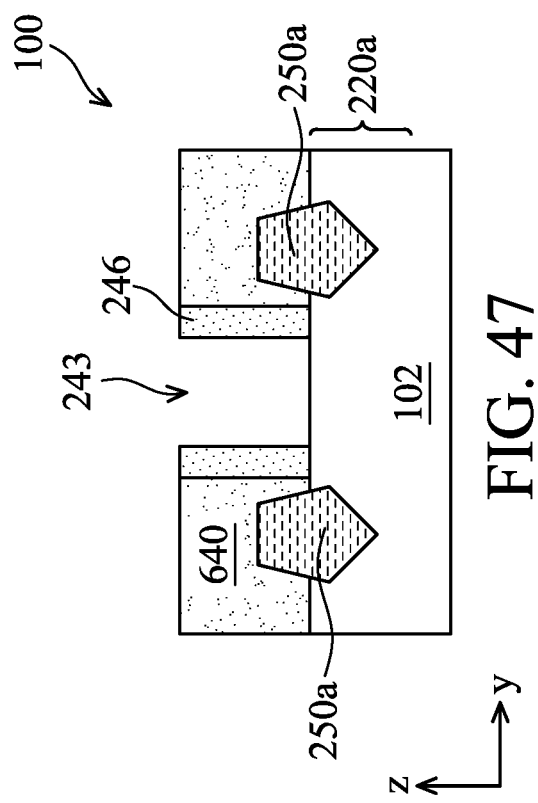
Figure 50:
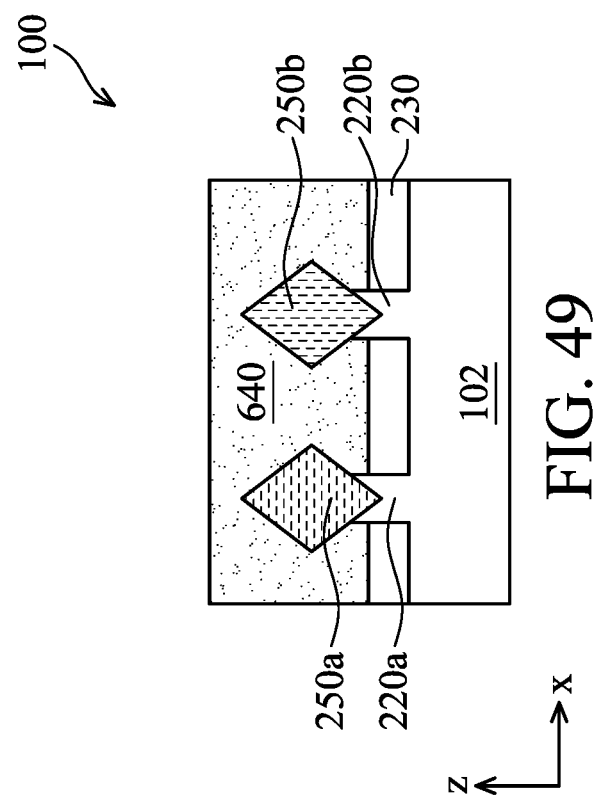

FIG. 20 is a flow chart of a method 500 for fabricating the semiconductor structure 100 discussed above in accordance with FIGS. 1-8 and 10-19 according to various aspects of the present disclosure. Additional operations can be provided before, during, and after method 500, and some of the operations described can be moved, replaced, or eliminated for additional embodiments of method 500. Method 500 is described below in conjunction with 21-54, which illustrate various cross-sectional views of the semiconductor structure 100 at various steps of fabrication according to the method 500, in accordance with some embodiments. Among these figures, FIGS. 21 and 22 are three-dimensional perspective views of the region A in device region 200 and region B in the seal ring region 300 of the semiconductor structure 100 in FIG. 1; FIGS. 23, 27, 31, 35, 39, 43, 47, and 51 are cross-sectional views of the semiconductor structure 100 along line "6-6" in FIG. 21; FIGS. 24, 28, 32, 36, 40, 44, 48, and 52 are cross-sectional views of the semiconductor structure 100 along line "2-2" in FIG. 22; FIGS. 25, 29, 33, 37, 41, 45, 49, and 53 are cross-sectional views of the semiconductor structure 100 along line "7-7" in FIG. 21; and FIGS. 26, 30, 34, 38, 42, 46, 50, and 54 are cross-sectional views of the semiconductor structure 100 along line "1-1" in FIG. 22.

The semiconductor structure 100 discussed in detail below illustrates FinFETs in the device region 200 and components of FinFET in the seal ring region 300 as illustrated in conjunction with FIGS. 1-9 and 17-19. The embodiments are provided for simplification and ease of understanding and does not necessarily limit the embodiments to any types of devices, any number of devices, any number of regions, or any configuration of structures of regions. For example, the same inventive concept can be applied in fabricating devices with GAA transistors. Furthermore, the semiconductor structure 100 may be an intermediate device fabricated during processing of an IC, or a portion thereof, that may comprise static random access memory (SRAM) and/or logic circuits, passive components such as resistors, capacitors, and inductors, and active components such as PFETs, NFETs, FinFETs, GAA FET, MOSFET, CMOS transistors, bipolar transistors, high voltage transistors, high frequency transistors, other memory cells, and combinations thereof. Throughout the present disclosure, unless otherwise excepted, like reference numerals denote like features.

At operation 502, referring to FIGS. 20 and 23-30, the method 500 receives a semiconductor substrate (or substrate) 102. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

The substrate 102 further includes fins (or active regions) 220 (including 220a and 220b adjacent to the fins 220a) in the device region 200 and the fin rings 320 in the seal ring region 300. The fins 220 are formed along parallel lines along Y direction in the device region 200, and each of the fin rings 320 are formed in a ring shape in the seal ring region 300 enclosing the circuit region 200. In the present disclosure, the fins 220 and fin rings 320 are considered as part of the substrate 102. The fins 220 and fin rings 320 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 220 and fin rings 320 on the substrate 102. The etching process can include dry etching, wet etching, reactive ion etching (RIE), and/or other suitable processes. Alternatively, in the present embodiments, the fins 220 and fin rings 320 are formed using double-patterning lithography (DPL) processes, in which mandrels are used to form the fins 220 and fin rings 320. Mandrels are formed over the substrate 102 to support the forming of thinner spacers over the sidewalls thereof. The mandrels are subsequently removed and leaving the spacers standing alone as a mask to etch the substrate 102. The portions of the substrate 102 protected under the spacers form fins 220 and fin rings 320. The fins 220 and fin rings 320 may be formed in pairs derived from two sidewalls of a mandrel. Numerous other embodiments of methods to form the fins 220 and fin rings 320 may be suitable.

The adjacent fins 220 and adjacent fin rings 320 are separated by isolation structures 230 and isolation rings 330, respectively. The isolation structures 230 and isolation rings 330 may be formed of silicon oxide, silicon nitride, silicon oxynitride, fluoride-doped silicate glass (FSG), a low-k dielectric material, and/or other suitable insulating material. The isolation structures 230 and isolation rings 330 may be shallow trench isolation (STI) structures. In an embodiment, the isolation structures 230 and isolation rings 330 are formed by etching trenches in the substrate 102, e.g., as part of the fins 220 and fin rings 320 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structures 230 and isolation rings 330 may include a multi-layer structure, for example, having one or more thermal oxide liner layers.

Still referring to FIGS. 20 and 23-30, the method 500 further forms dummy gate structures 241 in the circuit region 200 and the dummy gate rings 341 in the seal ring region 300. The dummy gate structures 241 are disposed lengthwise substantially perpendicular with a lengthwise direction of the fins 220, while the dummy gate rings 341 are disposed lengthwise substantially parallel to a lengthwise direction of the fin rings 320. The dummy gate structures 241 and dummy gate rings 341 may include gate spacers 246 and 346 (respectively), a hard mask layer (not shown) and a capping layer (not shown). The gate spacers 246 and 346 may comprise a single layer or multilayer structure and may comprise a dielectric material such as silicon nitride (SiN). In an embodiment, the dummy gate structures 241 and dummy gate rings 341 include polysilicon. The gate spacers 246 and 346 may be formed by ALD, thermal deposition, or other suitable methods. In some embodiments, the dummy gate structures 241 and dummy gate rings 341 are sacrificial gate structures, i.e., placeholder for final gate stacks. In the present disclosure, the fins 220 and fin rings 320, the isolation structures 230 and isolation rings 330, the dummy gate structures 241, and the dummy gate rings 341 are considered as part of the substrate 102. In some embodiments, the epitaxial structures and the gate structures are not formed in the inner corner region 306 as explained with respect to FIG. 19.

At operation 504, referring to FIGS. 20 and 27-30, the method 500 etches the fins 220a in the circuit region and the fins 320 in the seal ring region to form recesses 222 and 324 respectively, while the fins 220b in the circuit region are protected under a mask 600. The etching process may be dry (plasma) etching, wet etching, and the like. In an embodiment, the etching process includes a dry etching process that utilizes a combination of $HBr/Cl_2/O_2/He$. In another embodiment, the etching process includes a dry etching process that utilizes a combination of $GeH_4/HCl/H_2/N_2$. The mask 600 may include a photo resist mask or other suitable mask and is removed after the etching process. Thereafter, a cleaning process may be performed that cleans the recesses 222 and 324 with a hydrofluoric acid (HF) solution or other suitable solution.

At operation 506, referring to FIGS. 20 and 31-34, the method 500 proceeds to grow epitaxial structures 250a in the recesses 222 and epitaxial rings 350 in the recesses 324. The epitaxial structures 250a and the epitaxial rings 350 in the seal ring region 300 are formed simultaneously in an epitaxy process and include the same material as discussed with respect to FIG. 2. The epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the fins 220a and fin rings 320. The epitaxial structures 250a and the epitaxial rings 350 may include silicon germanium or germanium and can be doped with boron, other p-type dopant, or combinations thereof. Alternatively, the epitaxial structures 250a and the epitaxial rings 350 may include silicon and can be doped with carbon, phosphorous, arsenic, other n-type dopant, or combinations thereof. In another alternative embodiment, the epitaxial rings 350 may include silicon germanium, germanium or silicon without dopants in some embodiments. The undoped epitaxial rings 350 are formed in separate processes than the epitaxial structures 250a. In the present embodiments, the epitaxial structures 250a and the epitaxial rings 350 include silicon germanium doped p-type dopants. In some embodiments, the epitaxial structures 250a and the epitaxial rings 350 include more than one epitaxial semiconductor layer.

At operation 508, referring to FIGS. 20 and 35-38, the method 500 forms a mask 620 over the semiconductor structure 100. The mask 620 completely covers the seal ring region 300 and partially covers the circuit region 200. For example, the epitaxial structures 250a are covered under the mask 620 and the fins 220b in the circuit region 200 are exposed. The mask 620 prevent the inadvertent damages to the seal ring region (especially to the epitaxial rings 350) and the device region during the subsequent processes, such as the forming of the epitaxial structures 250b as explained below. The mask 620 may include the same compositions as those included in the mask 600 discusses with respect to FIGS. 27-30 and may be formed similarly as the mask 600.

At operation 510, referring to FIGS. 39-42, the method 500 etches the fins 220b to form recesses 224 in the S/D regions of the fins 220b, while a portion of the circuit region 200 and the entire seal ring region 300 are covered by the mask 620. The etching process may be dry (plasma) etching, wet etching, and the like. The etching of the fins 220b may inadvertently damage other components of the semiconductor structure 100. For example, the etching of the fins 220b may accidentally etch portions of the epitaxial structures 250a in the case of misalignments. If the epitaxial rings 350 in the seal ring region 300 are etched inadvertently during the etching of the recesses 224, the stability and reliability of the seal ring structure 302 will be affected. In the present embodiments, the entire seal ring region 300 is completely covered by the mask 620. The mask 620 prevents any inadvertent damage that might occur during the etching of the recesses 224, thereby improving the stability and reliability of the seal ring structure 302. It is noted that the only epitaxial rings in the seal ring region 300 are the epitaxial rings 350. The epitaxial rings 350 are single type selected from n-type, p-type, or undoped epitaxial rings. In other words, all epitaxial rings in the seal ring region 300 are a same type selected from n-type, p-type, or undoped epitaxial rings.

At operation 512, referring to FIGS. 20 and 43-46, the method 500 proceeds to grow epitaxial structures 250b in the recesses 224 in the circuit region 200. The epitaxial structures 250b includes a material that is different from the material included in the epitaxial structures 250a and epitaxial rings 350. For example, the epitaxial structures 250b is n-type epitaxial structures if the epitaxial structures 250a and the epitaxial rings 350 are p-type epitaxial structures. Similarly, the epitaxial structures 250b is p-type epitaxial structures if the epitaxial structures 250a and the epitaxial rings 350 are n-type epitaxial structures. The seal ring region 300 is completely covered under the mask 620 during the forming of the epitaxial structures 250b, and thereby remain having a single type of epitaxial rings 350 and being free of the epitaxial structures 250b. In some embodiments, the epitaxial structures 250a, 250b, and the epitaxial rings 350 are not formed in the inner corner region 306. The mask 620 is subsequently removed using any suitable process, such as ashing and/or resist stripping.

At operation 514, referring to FIGS. 20 and 47-54, the method 500 performs further operations including, for example, replacement of the dummy gate structures 241 and dummy gate rings 341 with gate structures 240 and gate rings 340, respectively, and formation of contact structures 260 and contact rings 360.

Referring to FIGS. 47-50, an inter-layer dielectric (ILD) layer 640 is formed over the substrate 102 by procedures such as deposition and CMP. In an embodiment, the ILD layer 640 is formed by a flowable CVD (FCVD) process. Then, a CMP process is performed to the ILD layer 640 to expose the dummy gate structures 241 and dummy gate rings 341. Subsequently, the dummy gate structures 241 and dummy gate rings 341 are removed by one or more selective etching processes, thereby forming openings 243 in the circuit region 200 and openings 343 in the seal ring region 300. The gate spacers 246 and 346 are intact during the etch processes.

Referring to FIGS. 51-54, one or more material layers are deposited into the openings 243 and 343 to form gate structures 240 and gate rings 340, respectively. In the present embodiments, the gate structure 240 and gate rings 340 each includes gate dielectric layers 242 and 342, gate electrodes 244 and 344 over the gate dielectric layers 242 and 342, respectively. The gate dielectric layers 242 and 342 may each include a high-k dielectric material, such as $HfO_2$, $La_2O_3$, other suitable materials, or combinations thereof. The metal gate electrodes 244 and 344 may each includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, TaSi$_2$, NiSi$_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The gate structure 240 and gate rings 340 may further include other material layers (not depicted), such as an interfacial, a capping layer, a barrier layer, other suitable layers, or combinations thereof. Various layers of the gate structures 240 and gate rings 340 may be formed by various methods, including ALD, CVD, PVD, plating, other suitable methods, or combinations thereof. After forming the bulk conductive layer, one or more CMP processes are performed to remove excessive material formed on top surface of the ILD layer 640, thereby planarizing the semiconductor structure 100.

Still referring to FIGS. 20 and 51-54, the method 500 at operation 514 further forms contact structures 260 and contact rings 360 over the epitaxial structures 250a, 250b, and/or the epitaxial rings 350, respectively. Each of the contact structures 260 and contact rings 360 may include any suitable conductive material, such as Co, W, Ru, Cu, Al, Ti, Ni, Au, Pt, Pd, and/or other suitable conductive materials. Method 500 may form an S/D contact opening (or trench, not shown) in the interlayer dielectric layer 640 via a series of patterning and etching processes and subsequently deposit a conductive material in the S/D contact opening using any suitable method, such as CVD, ALD, physical vapor deposition (PVD), plating, and/or other suitable processes.

The method 500 at operation 514 may perform further fabrications, such as mid-end-of-line (MEOL) processes and back-end-of-line (BEOL) processes. For example, the method 500 may form gate vias connecting to the gate structures 240 and/or gate rings 340, form contact vias connecting to the contact structures 260 and contact rings 360, and form one or more interconnect layers with wires and vias embedded in dielectric layers. The one or more interconnect layers connect gate, source, and drain electrodes of various transistors, as well as other circuits in the circuit region 200, to form an integrated circuit in part or in whole. The one or more interconnect layers also form part of the seal ring 300. The method 500 may also form passivation layer(s) over the interconnect layers.

Although not intended to be limiting, embodiments of the present disclosure provide one or more of the following advantages. For example, embodiments of the present disclosure provide a semiconductor structure with a seal ring region including a single type of epitaxially structures. In other words, all of the epitaxial structures in the seal ring region are n-type, p-type, or un-doped. In one example, the epitaxial structures in the seal ring region are all p-type and free of n-type and undoped epitaxial structures. In another example, the epitaxial rings in the seal ring region are all n-type and free of p-type and undoped epitaxial structures. The single type epitaxial rings in the seal ring region prevent inadvertent damages that might occur during the forming of multi-type epitaxial structures, thereby improving the processability and seal ring stability.

In another example, embodiments of the present disclosure provide a method of forming a seal ring region including a single type of epitaxially structures. In the embodiments, first epitaxial structures in the seal ring region are formed simultaneously with second epitaxial structures in the circuit region, where the first epitaxial structures and the second epitaxial structures includes a same material (e.g., silicon germanium doped with p-type dopants). Thereafter, third epitaxial structures are formed in the circuit region but not the seal ring region, where the third epitaxial structures include a material (e.g., silicon doped with n-type dopants) different from the first material. Embodiments of the present disclosure can be readily integrated into existing semiconductor manufacturing processes.

In one example aspect, the present disclosure is directed to a semiconductor structure. The semiconductor structure includes a circuit region disposed over a substrate and a seal ring region disposed over the substrate and completely surrounding the circuit region. The circuit region includes first fins, second fins, n-type epitaxial structures over the first fins, and p-type epitaxial structures over the second fins. The seal ring region includes fin rings extending completely around the circuit region, epitaxial rings disposed over and extending parallel to the fin rings. All of the epitaxial rings over all of the fin rings in the seal ring region are p-type epitaxial rings.

In some embodiments, the semiconductor structure further includes contact rings disposed over the extending parallel to the epitaxial rings. Each of the contact rings completely surrounds the circuit region. In some instances, the semiconductor structure further includes silicide rings disposed between the epitaxial rings and the contact rings. Each of the silicide rings extends completely around the circuit region. In some implementations, a first epitaxial ring of the epitaxial rings is disposed over and extends parallel to a first subset of the fin rings, and a second epitaxial ring of the epitaxial rings is disposed over and extends parallel to a second subset of the fin rings. In some instances, the first epitaxial ring and the second epitaxial ring are merged together to form a merged epitaxial ring. In some embodiments, the semiconductor structure further includes a first gate ring disposed over a third subset of the fin rings in the seal ring region, the third subset of fin rings being adjacent the first subset of fin rings, and a second gate ring disposed over a fourth subset of the fin rings in the seal ring region, the fourth subset of fin rings being adjacent to the second subset of fin rings. In some embodiments, first epitaxial ring and the second epitaxial ring are disposed between the first gate ring and the second gate ring. In some instances, the semiconductor structure further includes an outer corner region disposed outside a corner of the seal ring region, wherein the outer corner region includes first straight fin lines, and an inner corner region disposed between a corner of the seal ring region and a corner of the circuit region. The inner corner region includes second straight fin lines. The first straight fin lines and the second straight fin lines are disposed lengthwise along a same direction.

In another example aspect, the present disclosure is directed to a semiconductor structure. The semiconductor structure includes a substrate, a circuit region over the substrate, and a seal ring region over the substrate and completely surrounding the circuit region. The seal ring region includes a first plurality of fin rings and a second plurality of fin rings disposed on the substrate and completely surrounding the circuit region and epitaxial rings disposed over the first plurality of fin rings. Each of the epitaxial rings extends an entire length of the first plurality of fin rings and completely surround the circuit region. All epitaxial rings in the seal ring region include a same material and the second plurality of fin rings are free of the epitaxial rings.

In some embodiments, each of the epitaxial rings is formed over at least two fin rings of the first plurality of fin rings. In some implementations, the semiconductor structure further includes gate rings disposed over the second plurality of fin rings. Each of the gate rings extends an entire length of one of the second plurality of fin rings and completely surrounds the circuit region. In some embodiments, each of the gate rings are disposed over at least two of the second plurality of fin rings. In some instances, the epitaxial rings and the gate rings are alternatingly disposed in the seal ring region. In some instances, the epitaxial rings include silicon germanium doped with a p-type dopant.

In yet another example aspect, the present disclosure is directed to a method of forming a semiconductor structure. The method includes providing a semiconductor substrate with a seal ring region surrounding a device region, forming fins protruding from the semiconductor substrate in the device region and fin rings in the seal ring region, wherein each of the fin rings completely surrounds the device region, recessing top portions of the fins and the fin rings, simultaneously growing first epitaxial structures over the recessed fins and epitaxial rings over the recessed fin rings, wherein the first epitaxial structures and the epitaxial rings include a first material, thereafter, forming a mask covering an entirety of the seal ring region and exposes portions of the device region, etching the exposed portions of the device region to form recesses, and growing second epitaxial structures in the recesses, wherein the second epitaxial structures include a second material different from the first material.

In some embodiments, the semiconductor substrate further includes an outer corner region adjacent to a corner of the seal ring region and spaced apart from the device region by the seal ring region. The semiconductor substrate further includes an inner corner region adjacent to the corner of the seal ring region and spaced apart from the outer corner region by the seal ring region. The method further includes simultaneously forming straight fin lines in the outer corner region and the inner corner region during the forming of the fins and the fin rings, and simultaneously forming straight epitaxial lines over a portion of the straight fin lines in the outer corner region during the forming of the first epitaxial structures and the epitaxial rings, while the inner corner region is covered by a mask layer. In some implementations, the straight epitaxial lines include a material that is the same as the first material. In some instances, the method further includes simultaneously forming contact structures over the straight epitaxial lines in the outer corner region and over the straight fin lines in the inner corner region. In some embodiments, a remaining portion of the straight fin lines in the outer corner region is excluded from the forming the straight epitaxial lines and the method further includes forming a silicide layer over the straight epitaxial lines in the outer corner region and the remaining portion of the straight fin lines in the outer corner region. In some embodiments, the method may further include forming contact structures over the silicide layer in the outer corner region and the inner corner region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a circuit region disposed over a substrate, wherein the circuit region comprises first fins, second fins, n-type epitaxial structures over the first fins, and p-type epitaxial structures over the second fins; and
   a seal ring region disposed over the substrate and completely surrounding the circuit region, wherein the seal ring region comprises fin rings extending completely around the circuit region, epitaxial rings disposed over and extending parallel to the fin rings, wherein all of the epitaxial rings over all of the fin rings in the seal ring region are p-type epitaxial rings.

2. The semiconductor structure of claim 1, further comprising:
   contact rings disposed over the extending parallel to the epitaxial rings,
   wherein each of the contact rings completely surrounds the circuit region.

3. The semiconductor structure of claim 2, further comprising:
   silicide rings disposed between the epitaxial rings and the contact rings,
   wherein each of the silicide rings extends completely around the circuit region.

4. The semiconductor structure of claim 1, wherein:
   a first epitaxial ring of the epitaxial rings is disposed over and extends parallel to a first subset of the fin rings, and
   a second epitaxial ring of the epitaxial rings is disposed over and extends parallel to a second subset of the fin rings.

5. The semiconductor structure of claim 4, wherein the first epitaxial ring and the second epitaxial ring are merged together to form a merged epitaxial ring.

6. The semiconductor structure of claim 4, further comprising:
   a first gate ring disposed over a third subset of the fin rings in the seal ring region, the third subset of fin rings being adjacent the first subset of fin rings; and
   a second gate ring disposed over a fourth subset of the fin rings in the seal ring region, the fourth subset of fin rings being adjacent to the second subset of fin rings.

7. The semiconductor structure of claim 6, wherein first epitaxial ring and the second epitaxial ring are disposed between the first gate ring and the second gate ring.

8. The semiconductor structure of claim 1, further comprising:
   an outer corner region disposed outside a corner of the seal ring region, wherein the outer corner region comprises first straight fin lines; and
   an inner corner region disposed between the corner of the seal ring region and a corner of the circuit region, wherein the inner corner region comprises second straight fin lines, and wherein the first straight fin lines and the second straight fin lines are disposed lengthwise along a same direction.

9. A semiconductor structure, comprising:
   a substrate;
   a circuit region over the substrate; and
   a seal ring region over the substrate and completely surrounding the circuit region, wherein the seal ring region includes:
   a first plurality of fin rings and a second plurality of fin rings disposed on the substrate and completely surrounding the circuit region; and
   epitaxial rings disposed over the first plurality of fin rings, wherein each of the epitaxial rings extends an entire length of the first plurality of fin rings and completely surround the circuit region, and wherein all epitaxial rings in the seal ring region include a same material, wherein the second plurality of fin rings are free of the epitaxial rings.

10. The semiconductor structure of claim 9, wherein each of the epitaxial rings is formed over at least two fin rings of the first plurality of fin rings.

11. The semiconductor structure of claim 9, further comprising gate rings disposed over the second plurality of fin rings, wherein each of the gate rings extends an entire length of one of the second plurality of fin rings and completely surrounds the circuit region.

12. The semiconductor structure of claim 11, wherein each of the gate rings are disposed over at least two of the second plurality of fin rings.

13. The semiconductor structure of claim 11, wherein the epitaxial rings and the gate rings are alternatingly disposed in the seal ring region.

14. The semiconductor structure of claim 9, wherein the epitaxial rings comprise silicon germanium doped with a p-type dopant.

15. A method of forming a semiconductor structure, comprising:
prov100ing a semiconductor substrate with a seal ring region surrounding a device region;
forming fins protruding from the semiconductor substrate in the device region and fin rings in the seal ring region, wherein each of the fin rings completely surrounds the device region;
recessing top portions of the fins and the fin rings;
simultaneously growing first epitaxial structures over the recessed fins and epitaxial rings over the recessed fin rings, wherein the first epitaxial structures and the epitaxial rings include a first material;
thereafter, forming a mask covering an entirety of the seal ring region and exposes portions of the device region;
etching the exposed portions of the device region to form recesses; and
growing second epitaxial structures in the recesses, wherein the second epitaxial structures include a second material different from the first material.

16. The method of claim 15, wherein the semiconductor substrate further includes an outer corner region adjacent to a corner of the seal ring region and spaced apart from the device region by the seal ring region, wherein the semiconductor substrate further includes an inner corner region adjacent to the corner of the seal ring region and spaced apart from the outer corner region by the seal ring region, wherein the method further comprises:
simultaneously forming straight fin lines in the outer corner region and the inner corner region during the forming of the fins and the fin rings; and
simultaneously forming straight epitaxial lines over a portion of the straight fin lines in the outer corner region during the forming of the first epitaxial structures and the epitaxial rings, while the inner corner region is covered by a mask layer.

17. The method of claim 16, wherein the straight epitaxial lines include a material that is the same as the first material.

18. The method of claim 16, further comprising:
simultaneously forming contact structures over the straight epitaxial lines in the outer corner region and over the straight fin lines in the inner corner region.

19. The method of claim 16,
wherein a remaining portion of the straight fin lines in the outer corner region is excluded from the forming the straight epitaxial lines,
wherein the method further comprises forming a silicide layer over the straight epitaxial lines in the outer corner region and the remaining portion of the straight fin lines in the outer corner region.

20. The method of claim 19, further comprising:
forming contact structures over the silicide layer in the outer corner region and the inner corner region.

* * * * *